(12) United States Patent
Ryu et al.

(10) Patent No.: US 10,763,866 B2
(45) Date of Patent: Sep. 1, 2020

(54) ELECTRONIC CIRCUIT CONFIGURED TO ADJUST SAMPLING TIMING FOR RECOVERING DATA

(71) Applicant: SAMSUNG ELECTRONICS CO., LTD., Suwon-si, Gyeonggi-do (KR)

(72) Inventors: Kyungho Ryu, Yongin-si (KR); Hansu Pae, Seongnam-si (KR); Kilhoon Lee, Seoul (KR); Jaeyoul Lee, Hwaseong-si (KR); Jung-Pil Lim, Hwaseong-si (KR); Hyunwook Lim, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/511,733

(22) Filed: Jul. 15, 2019

(65) Prior Publication Data

US 2020/0169261 A1     May 28, 2020

(30) Foreign Application Priority Data

Nov. 22, 2018 (KR) .......................... 10-2018-0145025

(51) Int. Cl.
| | | |
|---|---|---|
| *H03D 3/24* | (2006.01) | |
| *H03L 7/091* | (2006.01) | |
| *G06F 1/08* | (2006.01) | |
| *H03L 7/08* | (2006.01) | |

(52) U.S. Cl.
CPC ................ *H03L 7/091* (2013.01); *G06F 1/08* (2013.01); *H03L 7/0807* (2013.01)

(58) Field of Classification Search
CPC ..... H03L 7/091; H03L 7/0807; H03D 13/004; H04L 7/033

USPC .......................................... 375/373–376, 355
See application file for complete search history.

(56) References Cited

U.S. PATENT DOCUMENTS

| | | | |
|---|---|---|---|
| 7,034,591 B2 | 4/2006 | Wang | |
| 7,418,069 B2 | 8/2008 | Schmatz et al. | |
| 8,019,022 B2 | 9/2011 | Liu et al. | |
| 9,407,424 B1 | 8/2016 | Holla et al. | |
| 9,780,794 B2 | 10/2017 | Tu et al. | |
| 9,791,492 B2 | 10/2017 | Lee et al. | |
| 9,866,223 B2 | 1/2018 | Guinea Trigo | |
| 2007/0297551 A1* | 12/2007 | Choi | H04L 7/033 375/371 |
| 2012/0200325 A1* | 8/2012 | Werner | H03D 13/004 327/156 |

(Continued)

FOREIGN PATENT DOCUMENTS

| | | |
|---|---|---|
| JP | 4866707 | 11/2011 |
| KR | 10-0791637 | 1/2008 |

(Continued)

*Primary Examiner* — Phuong Phu

(74) *Attorney, Agent, or Firm* — F. Chau & Associates, LLC

(57) ABSTRACT

An electronic circuit includes a clock recovery circuit that generates a first reference clock signal based on first reception data and generates a second reference clock signal based on second reception data received after the first reception, a sampling clock generator that generates a sampling clock signal having a phase based on a phase difference between the first reference clock signal and the second reference clock signal, and a sampler that recovers the second reception data based on the generated sampling clock signal.

19 Claims, 15 Drawing Sheets

(56) References Cited

U.S. PATENT DOCUMENTS

2018/0052194 A1     2/2018   Lee et al.
2018/0183633 A1     8/2018   Ho et al.

FOREIGN PATENT DOCUMENTS

KR     10-0892683     4/2009
WO     2017141258     8/2017

* cited by examiner

FIG. 10B

| Code | Decimal | Phase correction |
|------|---------|------------------|
| 0000 | -2 | -0.5UI |
| 1000 | -1 | -0.25UI |
| 1100 | 0 | 0UI |
| 1110 | 1 | 0.25UI |
| 1111 | 2 | 0.5UI |

ELECTRONIC CIRCUIT CONFIGURED TO ADJUST SAMPLING TIMING FOR RECOVERING DATA

CROSS-REFERENCE TO RELATED APPLICATIONS

This U.S. non-provisional patent application claims priority under 35 U.S.C. § 119 to Korean Patent Application No. 10-2018-0145025 filed on Nov. 22, 2018, in the Korean Intellectual Property Office, the disclosure of which is incorporated by reference in its entirety herein.

BACKGROUND

1. Technical Field

Embodiments of the inventive concept described herein relate to an electronic circuit, and more particularly, relate to an electronic circuit configured to adjust a sampling timing for recovering data.

2. Discussion of Related Art

An electronic device performs a unique function depending on operations of electronic circuits included therein. The electronic device may operate independently or in coordination with another electronic device. The electronic device may include a transmitter and a receiver for the purpose of communicating with the other electronic device.

The receiver of the electronic device may receive data from a transmitter of the other electronic device. The receiver may include a clock and data recovery (CDR) circuit that recovers a clock signal from received data and recovers data from the recovered clock signal. The CDR circuit may reduce complexity of a communication channel between the transmitter and the receiver and improve communication speed.

In an operation of the CDR circuit, an interval between received data may vary when a data jitter occurs. Thus, a sampling timing for recovering data may vary with a point in time to recover a clock signal. In this case, a mismatch between a timing to receive data and a sampling timing causes a sampling timing error. The sampling timing error may cause a bit error in the received data that is recovered. In particular, in the case where a jitter tolerance is not high, the probability that a bit error occurs due to a sampling timing may become high.

SUMMARY

At least one embodiment of the inventive concept provides an electronic circuit capable of adjusting a sampling timing for recovering data for the purpose of improving a jitter tolerance.

According to an exemplary embodiment of the inventive concept, an electronic circuit includes a clock recovery circuit that generates a first reference clock signal based on first reception data and generates a second reference clock signal based on second reception data received after the first reception data, a sampling clock generator that generates a sampling clock signal having a phase based on a phase difference between the first reference clock signal and the second reference clock signal, and a sampler that recovers the second reception data based on the generated sampling clock signal.

According to an exemplary embodiment of the inventive concept, an electronic circuit includes a clock recovery circuit that generates a reference clock signal based on reception data, and a data recovery circuit that recovers the reception data based on a sampling clock signal having a phase selected according to a jitter value of the reception data at a recovery point of the reference clock signal.

According to an exemplary embodiment of the inventive concept, an electronic circuit includes a delay locked loop that outputs a first delay clock signal by delaying a first reference clock signal generated based on reception data by a reference delay time, a sampling clock generator that selects a first phase of a first sampling clock signal based on a first phase difference between a second reference clock signal generated based on the reception data and the first delay clock signal, and a sampler that recovers the reception data based on the first sampling clock signal having the selected first phase. The second reference clock signal is generated after the first reference clock signal is generated.

BRIEF DESCRIPTION OF THE FIGURES

The inventive concept will become apparent by describing in detail exemplary embodiments thereof with reference to the accompanying drawings.

FIG. 10B illustrates an example of a table for describing an operation of a sampling clock generator of FIG. 10A.

DETAILED DESCRIPTION OF THE EXEMPLARY EMBODIMENTS

Figure 1:
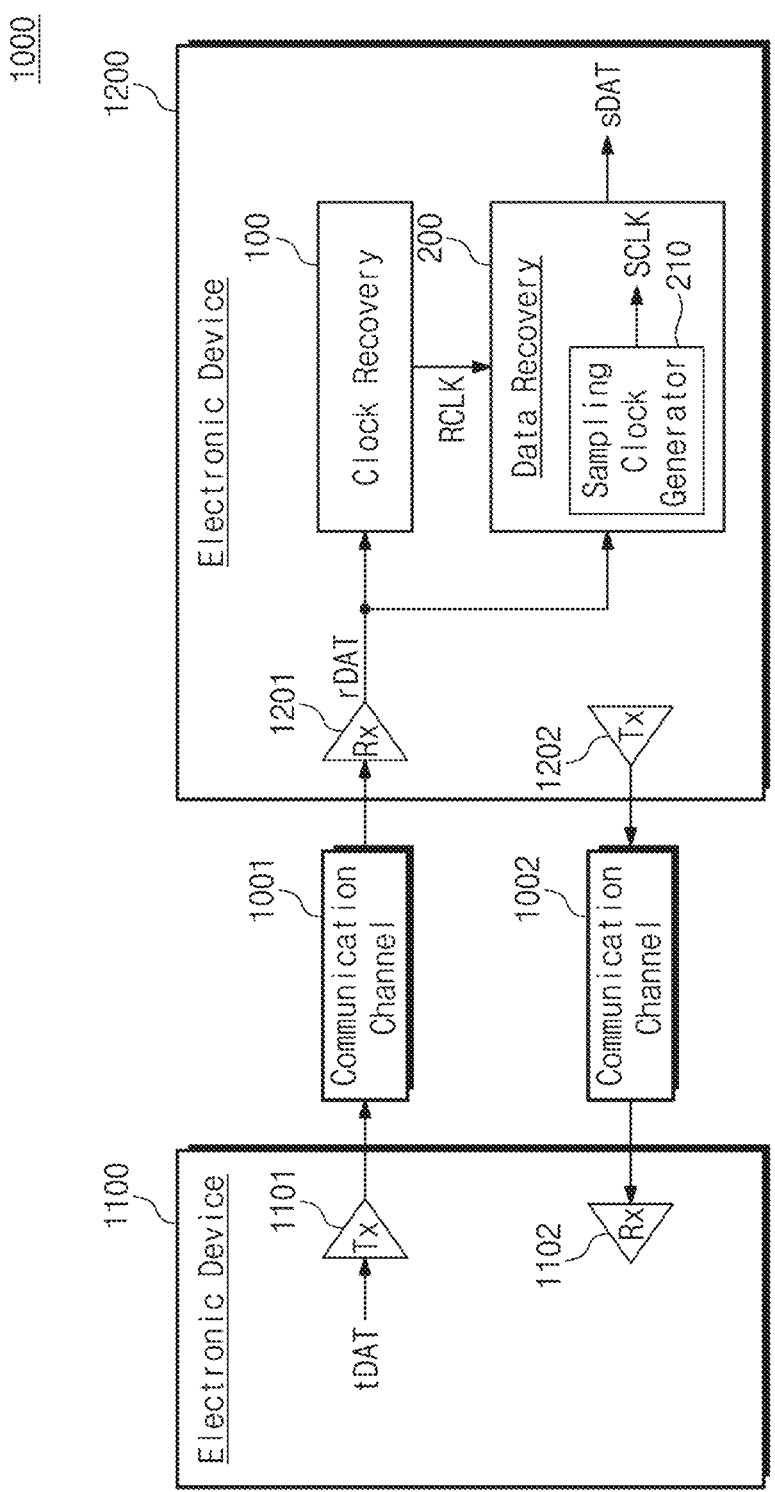
FIG. 1 is a block diagram illustrating an electronic system according to an exemplary embodiment of the inventive concept.

Hereinafter, exemplary embodiments of the inventive concept in conjunction with accompanying drawings will be described. Below, details, such as detailed configurations and structures are to aid a reader in understanding embodiments of the inventive concept. Therefore, embodiments described herein may be variously changed or modified without departing from embodiments of the inventive concept. The same reference numeral indicates the same part throughout the accompany drawings.

FIG. 1 is a block diagram illustrating an electronic system 1000 according to an exemplary embodiment of the inventive concept. Referring to FIG. 1, the electronic system 1000 includes electronic devices 1100 and 1200.

The electronic devices 1100 and 1200 may be various kinds of electronic devices. For example, each of the electronic devices 1100 and 1200 may be one of a desktop computer, a laptop computer, a tablet computer, a smartphone, a wearable device, an electric vehicle, a workstation, and a server system. The inventive concept is not limited thereto, and the electronic devices 1100 and 1200 may be implemented with any electronic device capable of communicating with each other.

The electronic device 1100 may communicate with the electronic device 1200 through communication channels 1001 and 1002. The electronic device 1100 includes a transmitter 1101 and a receiver 1102 for the purpose of communicating with the electronic device 1200. In an embodiment, the transmitter 1101 and the receiver 1102 is implemented by a transceiver. The electronic device 1200 includes a transmitter 1202 and a receiver 1201 for the purpose of communicating with the electronic device 1100. In an exemplary embodiment, the transmitter 1202 and the receiver 1201 are implemented by a transceiver. Each of the communication channels 1001 and 1002 may include a wired channel (e.g., a conductive line, a cable, or a metal pattern) for wired communication between the electronic devices 1100 and 1200 and/or a wireless channel (e.g., air or water) for wireless communication between the electronic devices 1100 and 1200.

Below, for convenience of description, descriptions associated with the transmitter 1202 and the receiver 1102 are omitted. Operations of the transmitter 1202 and the receiver 1102 may be substantially identical or similar to operations of the transmitter 1101 and the receiver 1201 to be described below.

The transmitter 1101 outputs a signal corresponding to transmission data tDAT. The transmission data tDAT may include information which is generated within the electronic device 1100 and will be transmitted to the electronic device 1200. A signal which is output from the transmitter 1101 may be provided to the receiver 1201 through the communication channel 1001. The transmitter 1101 may include various hardware circuits (e.g., an amplifier circuit, a modulator circuit, and an encoder circuit) for the purpose of appropriately outputting a signal corresponding to the transmission data tDAT.

The receiver 1201 may output reception data rDAT based on a signal provided through the communication channel 1001. The reception data rDAT may include information corresponding to information included in the transmission data tDAT. The receiver 1201 may include various hardware circuits (e.g., an amplifier circuit, a demodulator circuit, and a decoder circuit) for the purpose of appropriately outputting the reception data rDAT from the received signal.

The transmitter 1101 and the receiver 1201 may be configured to operate in compliance with one or more of various interface protocols depending on a type of the communication channel 1001. For example, the transmitter 1101 and the receiver 1201 may support at least one of various wireless communication protocols such as a transfer control protocol/Internet protocol (TCP/IP), universal serial bus (USB), and Firewire and/or at least one of various wired communication protocols such as long term evolution (LTE), worldwide interoperability for microwave access (WIMAX), global system for mobile communications (GSM), code division multiple access (CDMA), Bluetooth, wireless fidelity (Wi-Fi), and radio frequency identification (RFID).

The electronic device 1200 includes a clock recovery circuit 100 and a data recovery circuit 200. The clock recovery circuit 100 and the data recovery circuit 200 may be implemented with an electronic circuit including various analog and/or digital circuits for the purpose of performing operations to be described below. The clock recovery circuit 100 and the data recovery circuit 200 may be implemented with one clock data recovery (CDR) circuit. However, the inventive concept is not limited thereto. For example, the clock recovery circuit 100 and the data recovery circuit 200 may be implemented with separate circuits, respectively.

The clock recovery circuit 100 generates a reference clock signal RCLK based on the reception data rDAT. In an embodiment, the clock recovery circuit 100 generates the reference clock signal RCLK based on a transition of a data value of the reception data rDAT. For example, the clock recovery circuit 100 may sense a transition timing of a data value of the reception data rDAT, and generate the reference clock signal RCLK having a rising edge or a falling edge at the transition timing.

In an embodiment, the reception data rDAT includes a plurality of packets (e.g., data packets). A length of each of the packets included in the reception data rDAT may be defined in compliance with the interface protocol between the transmitter 1101 and the receiver 1201. The clock recovery circuit 100 may generate the reference clock signal RCLK in units of the packet. For example, the clock recovery circuit 100 may generate a first reference clock signal RCLK based on a transition of a data value at a start point of a first packet, and may generate a second reference clock signal RCLK based on a transition of a data value at a start point of a second packet. That is, a point where the reference clock signal RCLK is generated may vary with a packet length of the reception data rDAT.

The data recovery circuit 200 receives the reference clock signal RCLK from the clock recovery circuit 100 and receives the reception data rDAT from the receiver 1201. The data recovery circuit 200 may recover the reception data rDAT based on the reference clock signal RCLK. As such, the data recovery circuit 200 may generate recovered data sDAT. The recovered data sDAT may correspond to the transmission data tDAT, which the electronic device 1100 intended to transmit to the electronic device 1200. The electronic device 1200 may provide unique functions based on the recovered data sDAT.

The data recovery circuit 200 may include a sampling clock generator 210. The sampling clock generator 210 generates a sampling clock signal SCLK. In an embodiment, the sampling clock signal SCLK is generated based on the reference clock signal RCLK. For example, the sampling clock signal SCLK may be generated to have a given phase difference with respect to a phase of the reference clock signal RCLK. The data recovery circuit 200 samples the reception data rDAT based on the sampling clock signal SCLK. That is, the data recovery circuit 200 may sample the reception data rDAT to recover the reception data rDAT.

In an embodiment, the sampling clock generator 210 determines a jitter value of the reception data rDAT. The jitter value indicates a phase difference between a transition point of a data value of ideal reception data irDAT and a transition point of a data value of the actual reception data rDAT. For example, a jitter value of the reception data rDAT may vary with time due to various factors such as an influence of the communication channel 1001.

In an embodiment, the sampling clock generator 210 determines a jitter value of the reception data rDAT at a recover time point of the reference clock signal RCLK and selects a phase of the sampling clock signal SCLK depending on the determined jitter value. For example, in the case where a jitter value is within a reference range, the sampling clock generator 210 recovers the reception data rDAT based on the sampling clock signal SCLK having a preset phase. In the case where the jitter value exceeds the reference range, the sampling clock generator 210 corrects a phase of the sampling clock signal SCLK according to the jitter value and recovers the reception data rDAT based on the corrected sampling clock signal SCLK. In an exemplary embodiment, the preset phase is a phase determined from a phase of the reference clock signal RCLK without considering a jitter value. That is, a phase difference between the sampling clock signal SCLK having the preset phase and the reference clock signal RCLK may be a preset specific value.

As described above, the sampling clock generator 210 may dynamically adjust a phase of the sampling clock signal SCLK depending on a jitter value of the reception data rDAT at a recovery point of the reference clock signal RCLK. As such, a timing to sample the reception data rDAT may be adjusted according to a jitter value of the reception data rDAT. In this case, a sampling margin may be adjusted, and a jitter tolerance may be improved.

Figure 2A:
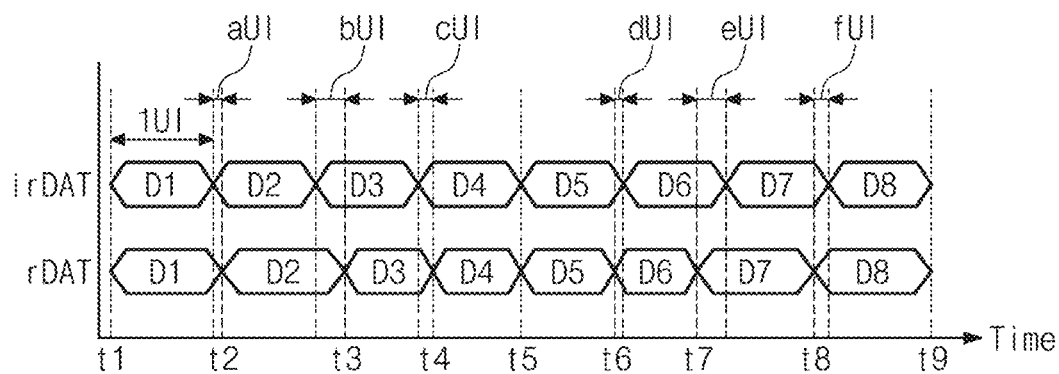
FIG. 2A is a timing diagram illustrating an example of a jitter value of reception data of FIG. 1.
Figure 2B:
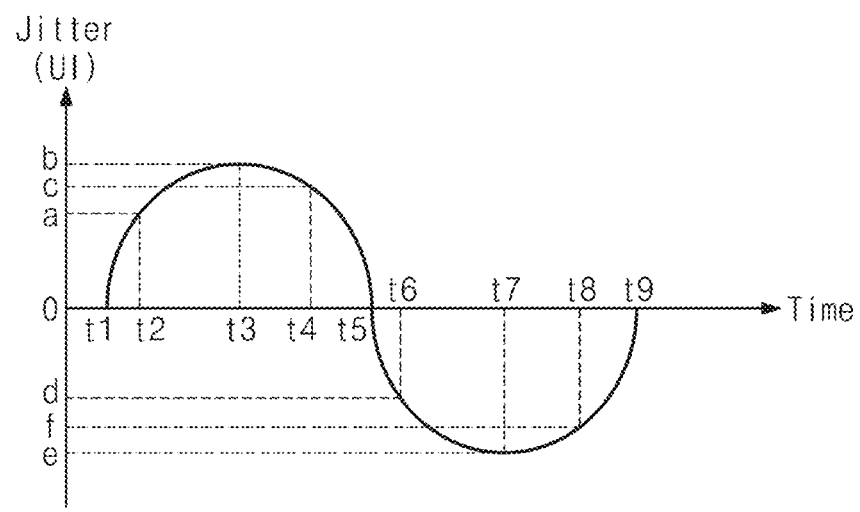
FIG. 2B is a graph illustrating an example of a jitter value of reception data of FIG. 1.

FIG. 2A is a timing diagram illustrating an example of a jitter value of the reception data rDAT of FIG. 1, and FIG. 2B is a graph illustrating an example of a jitter value of the reception data rDAT of FIG. 1. Referring to FIG. 2A, an eye diagram of the ideal reception data irDAT and the actual reception data rDAT over time is illustrated. In FIG. 2A, the horizontal axis represents time. The reception data irDAT may include first to eighth data symbols D1 to D8. Each of the data symbols D1 to D8 of the reception data irDAT may maintain a data value during the same time interval. That is, a data value of the reception data irDAT may be changed at a given period. For example, a data value of the reception data irDAT may be changed at 1 unit interval (UI). Here, "1 UI" may mean a time interval of one data symbol included in the ideal reception data irDAT.

The reception data rDAT may include first to eighth data symbols D1 to D8. Time intervals of the data symbols D1 to D8 of the reception data rDAT may not be identical. A time interval of each of the data symbols D1 to D8 may vary due to various factors in the process of receiving the reception data rDAT. As such, a jitter may occur in the reception data rDAT, and a jitter value of the reception data rDAT may change. Here, a jitter value of the reception data rDAT is determined by a phase difference between an edge point of a data symbol of the reception data rDAT and an edge point of a data symbol of the reception data irDAT.

As illustrated in FIG. 2A, first to ninth times t1 to t9 indicate edge points of data symbols of the reception data rDAT. A jitter value of the reception data rDAT may be determined by comparing a phase of the reception data rDAT and a phase of the reception data irDAT at the first to ninth times t1 to t9.

At the first time t1, the fifth time t5, and the ninth time t9, a phase of the reception data rDAT and a phase of the reception data irDAT are identical. As such, at the first time t1, the fifth time t5, and the ninth time t9, a jitter value of the reception data rDAT is "0 UI". At the second time t2, the phase of the reception data rDAT is delayed with respect to the phase of the reception data irDAT as much as "a UI". As such, at the second time t2, a jitter value of the reception data rDAT is "a UI". Likewise, at the third time t3, a jitter value of the reception data rDAT is "b UI"; at the fourth time t4, a jitter value of the reception data rDAT is "c UI". Since the phase of the reception data rDAT is delayed with respect to the phase of the reception data irDAT at the second to fourth times t2 to t4, the determined jitter value is a positive value. For example, a jitter value may be a value between "0 UI" and "1 UI", but the inventive concept is not limited thereto.

At the sixth time t6, the phase of the reception data rDAT is advanced with respect to the phase of the reception data irDAT as much as "d UI". As such, at the sixth time t6, a jitter value of the reception data rDAT is "d UI". Likewise, at the seventh time t7, a jitter value of the reception data rDAT is "e UI"; at the fourth time t8, a jitter value of the reception data rDAT is "f UI". Since the phase of the reception data rDAT is advanced with respect to the phase of the reception data irDAT at the sixth to eighth times t6 to t8, the determined jitter value is a negative value. For example, a jitter value may be a value between "−1 UI" and "0 UI", but the inventive concept is not limited thereto.

Referring to FIG. 2B, a change of a jitter value of the reception data rDAT over time is illustrated. In FIG. 2B, the horizontal axis represents time, and the vertical axis represents a jitter value. A unit of the jitter value may be a "UI". As illustrated in FIG. 2B, a change of a jitter value of the reception data rDAT may be in the form of a sine wave. Jitter values of the reception data rDAT of FIG. 2B include jitter values determined at the first to ninth times t1 to t9. As illustrated in FIG. 2B, a magnitude of a jitter at the first time t1, the fifth time t5, and the ninth time t9 is at a minimum value, and a magnitude of a jitter at the third time t3 and the seventh time t7 is at a maximum value. That is, a jitter value of the reception data rDAT may vary over time.

The example illustrated in FIGS. 2A and 2B as a jitter value of the reception data rDAT may be repeated at a period in the form of a sine wave, but the inventive concept is not limited thereto. For example, a jitter value of the reception data rDAT may be changed to various values regardless of a period. Below, for convenience of description, it is assumed that a jitter value of the reception data rDAT changes in the form of a sine wave of FIG. 2B.

Referring to FIGS. 1 to 2B, the clock recovery circuit 100 recovers the reference clock signal RCLK at one of the first to ninth times t1 to t9. In the case of using a phase of the reference clock signal RCLK recovered based on the reception data irDAT as a reference, a phase of the reference clock signal RCLK may vary with a jitter value of the reception data rDAT. That is, a phase of the reference clock signal RCLK may vary with a recovery point of the reference clock signal RCLK. For example, in the case where the reference clock signal RCLK is recovered at the first time t1, a phase of the reference clock RCLK is "0 UI". In the case where the reference clock signal RCLK is recovered at the third time t3, a phase of the reference clock RCLK is "b UI".

In an embodiment, the data recovery circuit 200 selects a phase of the sampling clock signal SCLK depending on a jitter value of the reception data rDAT at a recovery point of the reference clock signal RCLK. For example, a phase of the sampling clock signal SCLK which is selected when the reference clock signal RCLK is recovered at the first time t1 may be different from a phase of the sampling clock signal SCLK which is selected when the reference clock signal RCLK is recovered at the third time t3. Below, an operation of the data recovery circuit 200 according to a recovery point of the reference clock signal RCLK will be more fully described with reference to FIGS. 3A to 4B.

Figure 3A:
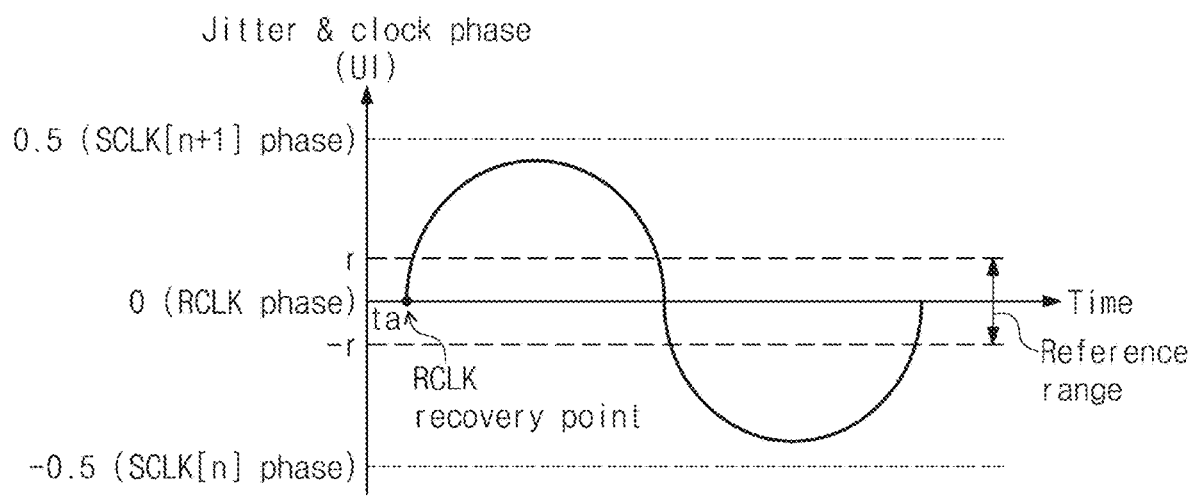
FIG. 3A is a graph for describing an example of a sampling clock generated when a jitter value of reception data is within a reference range, according to exemplary embodiment of the inventive concept.
Figure 3B:
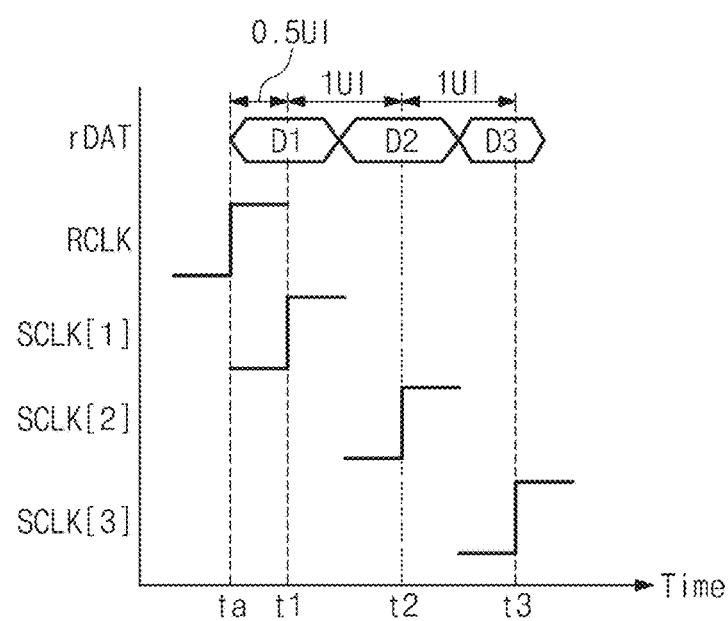
FIG. 3B is a timing diagram illustrating an example of a sampling clock generated when a jitter value of reception data is within a reference range, according to an exemplary embodiment of the inventive concept.

FIG. 3A is a graph for describing an example of the sampling clock signal SCLK generated when a jitter value of the reception data rDAT is within a reference range, according to an exemplary embodiment of the inventive concept. FIG. 3B is a timing diagram illustrating an example of the sampling clock signal SCLK generated when a jitter value of the reception data rDAT is within a reference range, according to an exemplary embodiment of the inventive concept.

Referring to FIG. 3A, a change of a jitter value of the reception data rDAT over time is illustrated in the form of a sine wave. In FIG. 3A, the horizontal axis represents time, and the vertical axis represents a jitter and clock signal phase. In the case where the reference clock signal RCLK is recovered at a time ta, a jitter value of the reference clock signal RCLK is "0 UI" at the recovery point ta of the reference clock signal RCLK. In this case, a jitter value of the reception data rDAT is a value within the reference range. In an exemplary embodiment, the reference range is a reference range in which a bit error does not occur even though the reception data rDAT is recovered based on the sampling clock signal SCLK having a preset phase (i.e., the sampling clock signal SCLK, the phase of which is not corrected). The reference range may be set in advance based on the degree of change of a jitter value of the reception data rDAT. For example, as illustrated in FIG. 3A, the reference range may be a range of a jitter value which is not smaller than "−r UI" and is not greater than "r UI", but the inventive concept is not limited thereto.

In the case where a jitter value is within the reference range, the sampling clock signal SCLK having the preset phase is generated. In this case, a phase of the sampling clock signal SCLK may be advanced or delayed with respect to a phase of the reference clock signal RCLK as much as "0.5 UI" or "−0.5 UI". That is, the preset phase may be a phase which has a phase difference of "0.5 UI" with a phase of the reference clock signal RCLK. As illustrated in FIG. 3A, assuming that a phase of the reference clock signal RCLK recovered at the time point ta where a jitter value of the reception data rDAT is "0 UI", a phase of the sampling clock signal SCLK may be "0.5 UI" or "−0.5 UI". For example, a phase of the sampling clock signal SCLK may be "0.5 UI" or "−0.5 UI" relative to the reference clock signal RCLK. For example, in the case where a phase of a sampling clock signal SCLK[n] is "−0.5 UI", the phase of the sampling clock SCLK[n+1] may be "0.5 UI". That is, a phase of the generated sampling clock signals SCLK[n] and SCLK[n+1] may be identical to the preset phase.

Referring to FIGS. 1 and 3B, the clock recovery circuit 100 recovers the reference clock signal RCLK based on the reception data rDAT including the first to third data symbols D1 to D3. The clock recovery circuit 100 may recover the reference clock signal RCLK at the time point ta where a jitter value is "0 UI". The data recovery circuit 200 may determine whether a jitter value of the reception data rDAT is within the reference range at the recovery point ta of the reference clock RCLK. As such, the data recovery circuit 200 may recover the reception data rDAT based on the sampling clock signal SCLK having the preset phase.

The data recovery circuit 200 may sample the reception data rDAT based on the sampling clock SCLK[1] delayed from the reference clock signal RCLK as much as "0.5 UI", the sampling clock signal SCLK[2] delayed from the sampling clock signal SCLK[1] as much as "1 UI", and the sampling clock signal SCLK[3] delayed from the sampling clock SCLK[2] as much as "1 UI". That is, at the first time t1, the second time t2, and the third time t3, the reception data rDAT may be sampled. In this case, even though a jitter value of the reception data rDAT changes, the reception data rDAT may be recovered without a bit error.

Figure 4A:
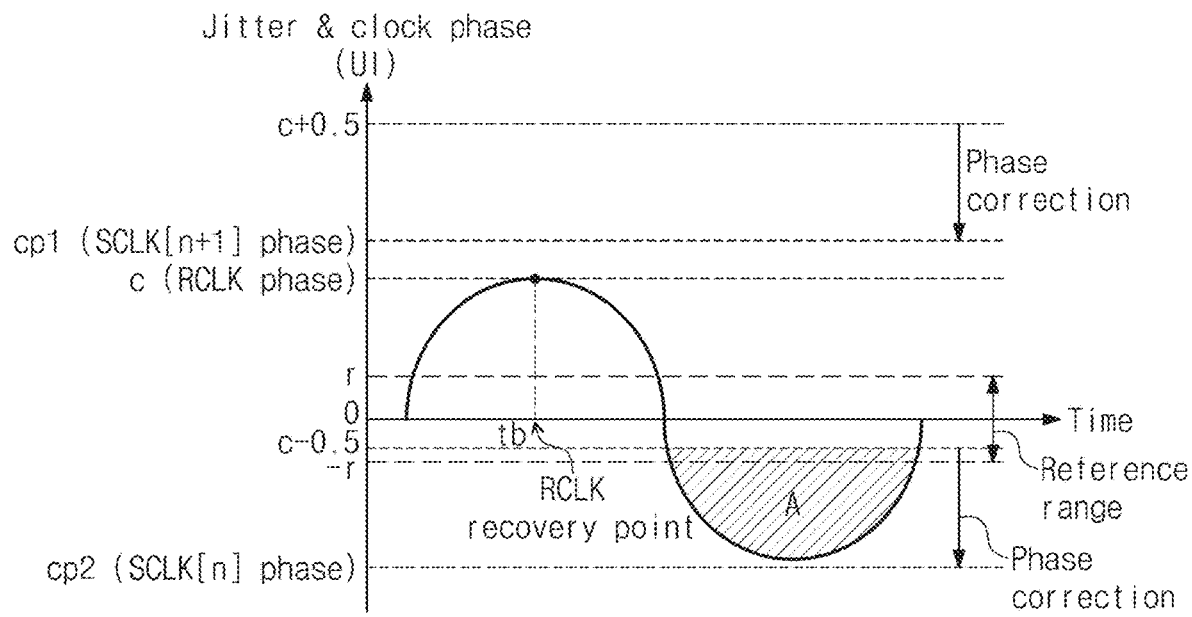
FIG. 4A is a graph for describing an example of a sampling clock generated when a jitter value of reception data exceeds a reference range, according to an exemplary embodiment of the inventive concept.
Figure 4B:
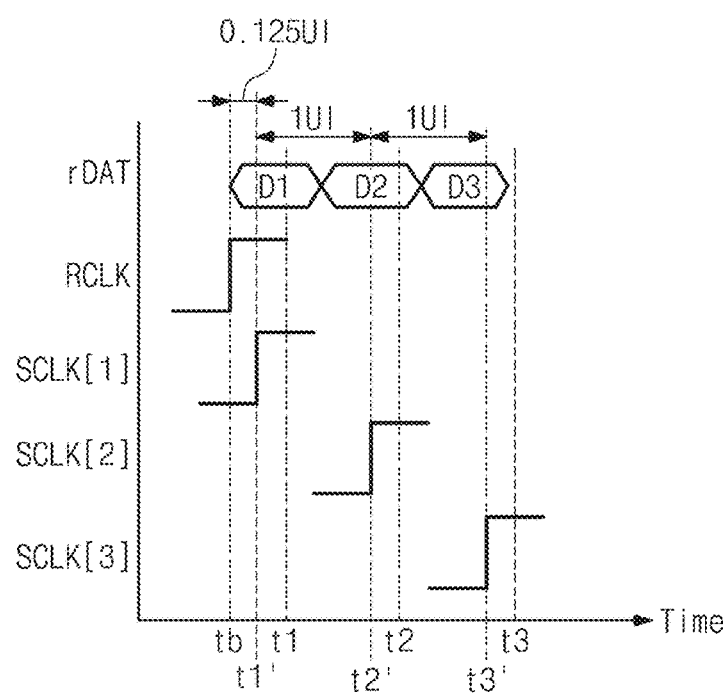
FIG. 4B is a timing diagram illustrating an example of a sampling clock generated when a jitter value of reception data exceeds a reference range, according to an exemplary embodiment of the inventive concept.

FIG. 4A is a graph for describing an example of the sampling clock SCLK generated when a jitter value of the reception data rDAT exceeds a reference range, according to an exemplary embodiment of the inventive concept. FIG. 4B is a timing diagram illustrating an example of the sampling clock signal SCLK generated when a jitter value of the reception data rDAT exceeds a reference range, according to an exemplary embodiment of the inventive concept.

Referring to FIG. 4A, a change of a jitter value of the reception data rDAT over time is illustrated in the form of a sine wave. In FIG. 4A, the horizontal axis represents time, and the vertical axis represents a jitter and clock phase. In the case where the reference clock signal RCLK is recovered at a time tb, a jitter value of the reception data rDAT is "c UI" at the recovery point tb of the reference clock signal RCLK. In this case, a jitter value of the reception data rDAT is a value exceeding the reference range.

In the case where a jitter value exceeds the reference range, the sampling clock signal SCLK having a phase (hereinafter referred to as a "corrected phase") corrected through comparison with the preset phase is generated. As illustrated in FIG. 4A, assuming that a phase of the reference clock signal RCLK recovered at the time point tb where a jitter value of the reception data rDAT is "c UI", the preset phase may be "c+0.5 UI" or "c−0.5 UI". The corrected phase according to the correction of the preset phase may be "cp1 UI" or "cp2 UI". For example, in the case where a phase of the sampling clock signal SCLK[n] is "cp2 UI", a phase of the sampling clock SCLK[n+1] is "cp1 UI". Since the phases of the sampling clock signals SCLK[n] and SCLK[n+1] are corrected based on the same phase correction value, the phases of the sampling clock signals SCLK[n] and SCLK[n+1] generated may be identical to the corrected phase.

The corrected phase values "cp1 UI" and "cp2 UI" may be determined according to a jitter value of the reception data rDAT at the recovery point tb of the reference clock signal RCLK. For example, the corrected phase may be advanced with respect to the preset phase as much as "c UI" being a jitter value of the reception data rDAT. However, the inventive concept is not limited thereto. For example, the corrected phase may be advanced with respect to the preset phase as much as a phase proportional to a jitter value of the reception data rDAT.

In the case where a phase of the sampling clock signal SCLK is not corrected even though a jitter value exceeds the reference range (i.e., in the case where a phase of the sampling clock signal SCLK is the preset phase), a bit error may occur in the recovered reception data rDAT (i.e., the recovered data sDAT). As illustrated in FIG. 4A, a bit error occurs in a period "A" where a jitter value of the reception data rDAT is smaller than "c-0.5 UI". In contrast, in the case where the phase of the sampling clock signal SCLK is corrected, a bit error does not occur in the period "A" where the jitter value of the reception data rDAT is smaller than "c-0.5 UI".

Referring to FIG. 4B, the clock recovery circuit 100 recovers the reference clock signal RCLK based on the reception data rDAT including the first to third data symbols D1 to D3. The clock recovery circuit 100 recovers the reference clock signal RCLK at the time point tb where a jitter value is "c UI". The data recovery circuit 200 determines whether the jitter value of the reception data rDAT exceeds the reference range at the recovery point tb of the reference clock signal RCLK. As such, the data recovery circuit 200 recovers the reception data rDAT based on the sampling clock signal SCLK having the corrected phase.

The data recovery circuit 200 samples the reception data rDAT based on the sampling clock signal SCLK[1] delayed from the reference clock signal RCLK as much as "0.125 UI", the sampling clock signal SCLK[2] delayed from the sampling clock signal SCLK[1] as much as "1 UI", and the sampling clock signal SCLK[3] delayed from the sampling clock signal SCLK[2] as much as "1 UI". That is, at a first time t1', a second time t2', and a third time t3', the reception data rDAT is sampled. In this case, even though a jitter value of the reception data rDAT changes, the reception data rDAT may be recovered without a bit error.

As such, the sampling clock signal SCLK having the corrected phase has rising edges at the first time t1', the second time t2', and the third time t3'. In contrast, in the case where the phase of the sampling clock signal SCLK is not corrected (i.e., in the case where the phase of the sampling clock signal SCLK is the preset phase), the sampling clock SCLK has rising edges at the first time t1, the second time t2, and the third time t3. In this case, as illustrated in FIG. 4B, a sampling timing error may occur with regard to the reception data rDAT. For example, a bit error associated with a value of the third data symbol D3 may occur.

Figure 5:
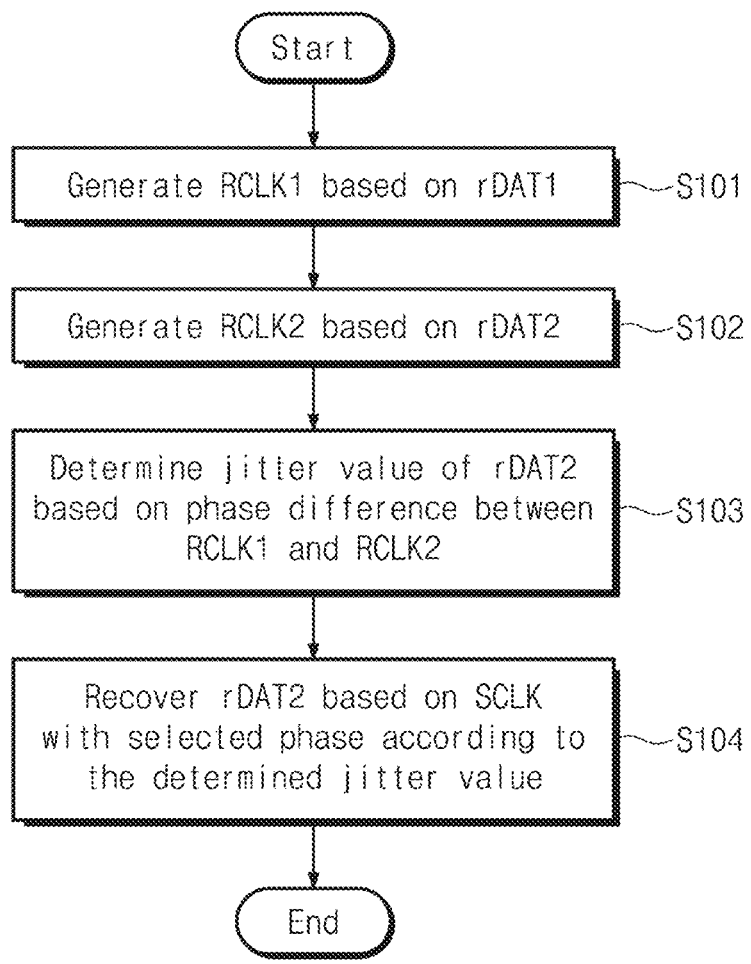
FIG. 5 is a flowchart illustrating an exemplary operation of a clock recovery circuit and a data recovery circuit of FIG. 1.

FIG. 5 is a flowchart illustrating an exemplary operation of the clock recovery circuit 100 and the data recovery circuit 200 of FIG. 1. Referring to FIGS. 1 and 5, in operation S101, the clock recovery circuit 100 generates a first reference clock signal RCLK1 based on first reception data rDAT1. For example, the clock recovery circuit 100 may generate the first reference clock signal RCLK1 based on transition of a data value of the first reception data rDAT1. In operation S102, the clock recovery circuit 100 generates a second reference clock signal RCLK2 based on second reception data rDAT2. For example, the clock recovery circuit 100 may generate the second reference clock signal RCLK2 based on transition of a data value of the second reception data rDAT2. The first reception data rDAT1 may correspond to a first packet, and the second reception data rDAT2 may correspond to a second packet received after the first packet. Since the first reception data rDAT1 is provided to the clock recovery circuit 100 prior to the second reception data rDAT2, the clock recovery circuit 100 may generate the first reference clock signal RCLK1 and may then generate the second reference clock signal RCLK2.

As such, the clock recovery circuit 100 may sequentially generate the reference clock signal RCLK whenever the reception data rDAT corresponding to one packet is provided (i.e., periodically).

In operation S103, the data recovery circuit 200 determines a jitter value of the second reception data rDAT2 based on a phase difference between the first reference clock signal RCLK1 and the second reference clock signal RCLK2. In an embodiment, the data recovery circuit 200 accumulates a phase difference between the first reference clock signal RCLK1 and the second reference clock signal RCLK2 and calculates the accumulated phase difference. The accumulated phase difference may be a value obtained by accumulating a phase difference between two reference clock signals RCLK sequentially generated. For example, the data recovery circuit 200 may accumulate a phase difference between the reference clock signal RCLK before the first reference clock signal RCLK1 and the first reference clock signal RCLK1 and a phase difference between the first reference clock signal RCLK1 and the second reference clock signal RCLK2 to calculate the accumulated phase difference. The data recovery circuit 200 may determine a jitter value of the second reception data rDAT2 based on the accumulated phase difference. How to determine a jitter value of the reception data rDAT based on a phase difference between two reference clock signals RCLK will be described below.

In operation S104, the data recovery circuit 200 recovers the second reception data rDAT2 based on the sampling clock signal SCLK having a phase selected according to the determined jitter value. For example, in the case where the determined jitter value is within the reference range, the data recovery circuit 200 selects the preset phase as a phase of the sampling clock signal SCLK and recovers the second reception data rDAT2 based on the sampling clock signal SCLK having the preset phase. In the case where the determined jitter value exceeds the reference range, the data recovery circuit 200 selects the corrected phase as a phase of the sampling clock signal SCLK and recovers the second reception data rDAT2 based on the sampling clock signal SCLK having the corrected phase.

Figure 6:
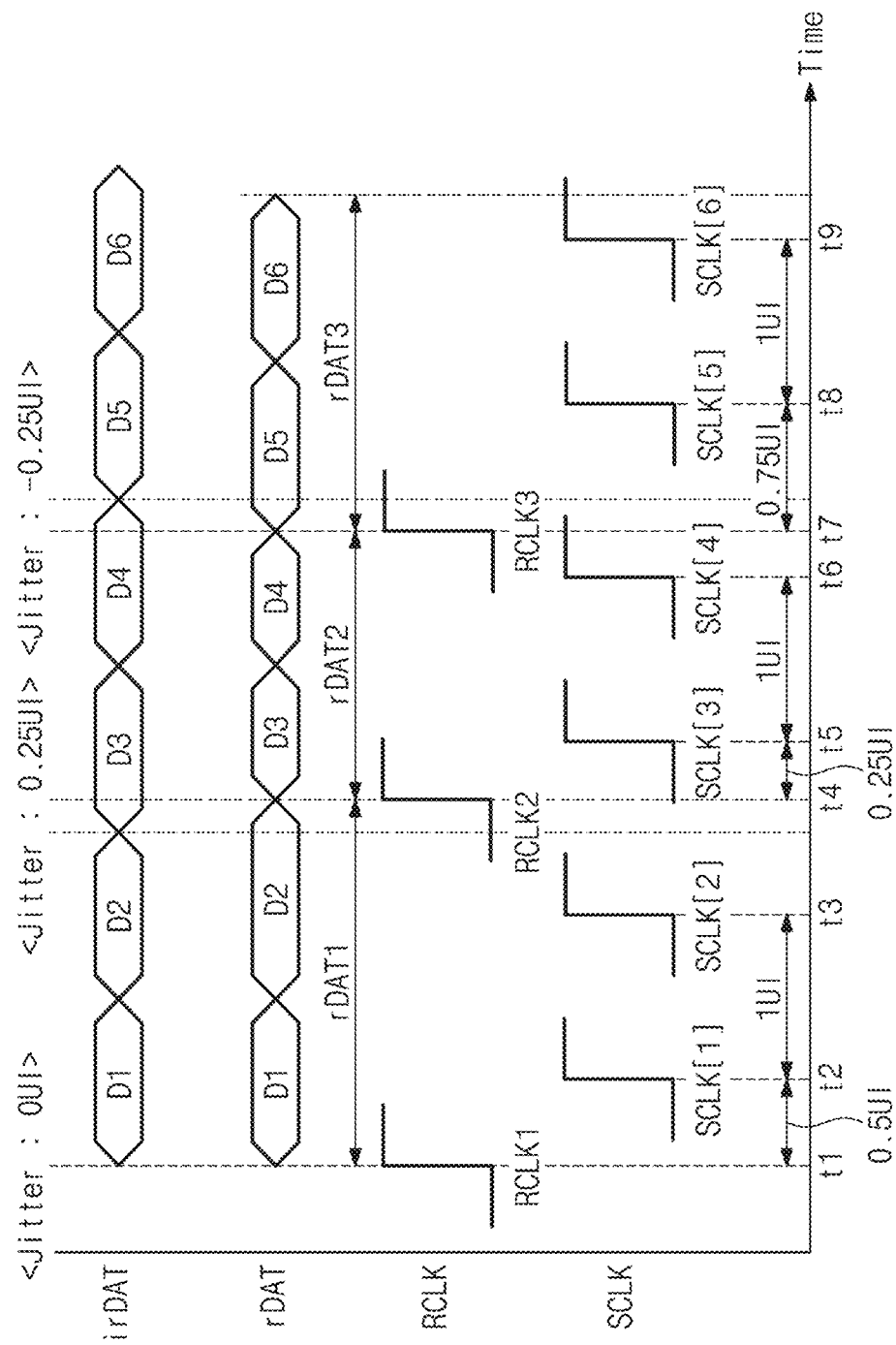
FIG. 6 is a timing diagram illustrating an example of a sampling clock generated according to an operation of FIG. 5.

FIG. 6 is a timing diagram illustrating an example of the sampling clock signal SCLK generated according to the operation of FIG. 5. Referring to FIGS. 1 and 6, first to third reception data rDAT1 to rDAT3 are sequentially provided. The first reception data rDAT1 includes first and second data symbols D1 and D2, the second reception data rDAT2 includes third and fourth data symbols D3 and D4, and the third reception data rDAT3 includes fifth and sixth data symbols D5 and D6.

The clock recovery circuit 100 generates a first reference clock signal RCLK1 based on the first reception data rDAT1. For example, the first reference signal RCLK1 may include a pulse having a rising edge when the start of the first reception data rDAT1 is detected at recovery point t1. A jitter value of the first reception data rDAT1 is "0 UI" at a recovery point t1 of the first reference clock signal RCLK1. That is, a phase of the first reference clock signal RCLK1 may be identical to a phase of the ideal reception data irDAT. In an embodiment, the first reference clock signal RCLK1 is generated to have the same phase as the phase of the reception data irDAT through a training operation.

In the case where the reception data rDAT is not provided before the first reference clock signal RCLK1 is generated (i.e., in the case where the previous reference clock signal RCLK is not generated), the data recovery circuit 200 may generate the sampling clock signals SCLK[1] and SCLK[2]

under the assumption that a jitter value is "0 UI" at the recovery point t1 of the first reference clock signal RCLK1. As such, the preset phase may be selected as phases of the sampling clock signals SCLK[1] and SCLK[2]. That is, a phase difference between the sampling clock signals SCLK[1] and SCLK[2] and the first reference clock signal RCLK1 may be "0.5 UI". The data recovery circuit 200 may sample the first reception data rDAT1 at a second time t2 and a third time t3 based on the sampling clock signals SCLK[1] and SCLK[2]. For example, the data recovery circuit 200 samples the first reception data rDAT1 at the second time t2 based on the first sampling clock signal SCLK[1] and samples the first reception data rDat1 at the third time t3 based on the second sampling clock signal SCLK[2]. As such, the first reception data rDAT1 may be recovered.

After the first reference clock signal RCLK1 is generated, the clock recovery circuit 100 generates a second reference clock signal RCLK2 based on the second reception data rDAT2. For example, the second reference signal RCLK2 may include a pulse having a rising edge when the start of the second reception data rDAT2 is detected at recovery point t4. A jitter value of the second reception data rDAT2 is "0.25 UI" at a recovery point t4 of the second reference clock signal RCLK2. Since a phase of the second reference clock signal RCLK2 is identical to a phase of the second reception data rDAT2, a phase difference between the first reference clock signal RCLK1 and the second reference clock RCLK2 is "0.25 UI". The data recovery circuit 200 determines that a jitter value of the second reception data rDAT2 is "0.25 UI", based on the phase difference.

The data recovery circuit 200 generates sampling clock signals SCLK[3] and SCLK[4] depending on the determined jitter value. The data recovery circuit 200 selects a phase, which is delayed with respect to the preset phase as much as "0.25 UI", as phases of the sampling clock signals SCLK[3] and SCLK[4]. That is, a phase difference between the sampling clock signals SCLK[3] and SCLK[4] and the second reference clock RCLK2 may be "0.25 UI". The data recovery circuit 200 samples the second reception data rDAT2 at a fifth time t5 and a sixth time t6 based on the sampling clocks SCLK[3] and SCLK[4]. For example, the data recovery circuit 200 samples the second reception data rDAT2 at the fifth time t5 based on the third sampling clock signal SCLK[3] and samples the second reception data rDat2 at the sixth time t6 based on the fourth sampling clock signal SCLK[4]. As such, the second reception data rDAT2 may be recovered.

After the second reference clock signal RCLK2 is generated, the clock recovery circuit 100 generates a third reference clock signal RCLK3 based on the third reception data rDAT3. For example, the third reference signal RCLK3 may include a pulse having a rising edge when the start of the third reception data rDAT3 is detected at recovery point t7. A jitter value of the third reception data rDAT3 is "−0.25 UI" at a recovery point t7 of the third reference clock RCLK3. In this case, a phase difference between the second reference clock signal RCLK2 and the third reference clock RCLK3 may be "−0.5 UI". The data recovery circuit 200 may accumulate "−0.5 UI", which is a phase difference between the second reference clock signal RCLK2 and the third reference clock signal RCLK3, on "0.25 UI" being a phase difference between the first reference clock signal RCLK1 and the second reference clock signal RCLK2. The data recovery circuit 200 may determine that a jitter value of the third reception data rDAT3 is "−0.25 UI", based on "−0.25 UI" being the accumulated phase difference.

The data recovery circuit 200 generates sampling clock signals SCLK[5] and SCLK[6] depending on the determined jitter value. The data recovery circuit 200 selects a phase, which is delayed with respect to the preset phase as much as "0.75 UI", as phases of the sampling clock signals SCLK[5] and SCLK[6]. That is, a phase difference between the sampling clock signals SCLK[5] and SCLK[6] and the third reference clock signal RCLK3 is "0.75 UI". The data recovery circuit 200 samples the third reception data rDAT3 at an eighth time t8 and a ninth time t9 based on the sampling clock signals SCLK[5] and SCLK[6]. For example, the data recovery circuit 200 samples the third reception data rDAT3 at the eighth time t8 based on the fifth sampling clock signal SCLK[5] and samples the third reception data rDat3 at the ninth time t9 based on the sixth sampling clock signal SCLK[6]. As such, the third reception data rDAT3 may be recovered.

As described above, the data recovery circuit 200 according to an embodiment of the inventive concept determines a jitter value of the reception data rDAT based on a phase difference between two reference clock signals RCLK which are continuously provided. For example, the data recovery circuit 200 may determine a jitter value of the reception data rDAT based on a phase difference between two sequentially provided reference clock signals. Below, an operation in which the data recovery circuit 200 calculates a phase difference between reference clock signals RCLK will be more fully described.

Figure 7:
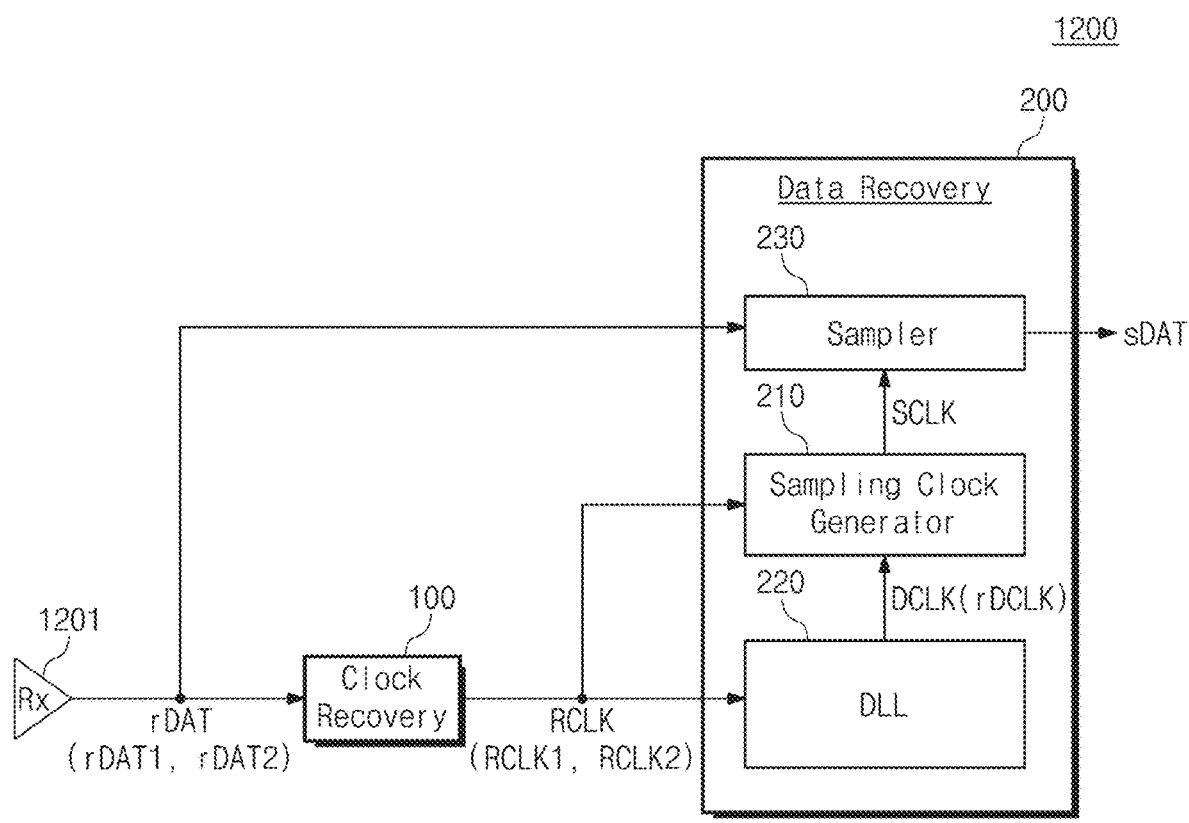
FIG. 7 is a block diagram illustrating a configuration of a data recovery circuit of FIG. 1.

FIG. 7 is a block diagram illustrating an exemplary configuration of the data recovery circuit 200 of FIG. 1. Referring to FIG. 7, the electronic device 1200 includes the receiver 1201, the clock recovery circuit 100, and the data recovery circuit 200. The receiver 1201 and the clock recovery circuit 100 of FIG. 7 are substantially identical or similar to the receiver 1201 and the clock recovery circuit 100 of FIG. 1, and thus, additional description will be omitted to avoid redundancy.

As illustrated in FIG. 7, the clock recovery circuit 100 provides the reference clock signal RCLK recovered based on the reception data rDAT to the data recovery circuit 200. For example, the clock recovery circuit 100 may provide the first reference clock signal RCLK1 recovered based on the first reception data rDAT1 to the data recovery circuit 200. Afterwards, the clock recovery circuit 100 provides the second reference clock signal RCLK2 recovered based on the second reception data rDAT2 to the data recovery circuit 200.

The data recovery circuit 200 includes the sampling clock generator 210, a delay locked loop (DLL) 220, and a sampler 230 (e.g., a sampling circuit). The delay locked loop 220 receives the reference clock signal RCLK from the clock recovery circuit 100. The delay locked loop 220 delays the reference clock signal RCLK to generate a delay clock signal DCLK. In an embodiment, the DLL is a digital circuit. The DLL may be similar to a phase locked loop, with the main difference being the absence of an internal voltage-controlled oscillator replaced with a delay line.

The delay locked loop 220 may generate the delay clock signal DCLK by delaying the reference clock signal RCLK depending on various delay times. For example, the delay clock signal DCLK may include a clock pulse delayed with respect to the reference clock signal RCLK as much as "0.5 UI" and clock pulses delayed at an interval of "1 UI" with respect to the clock pulse that is delayed as much as "0.5 UI". That is, in the case where a jitter value is within the reference range, the delay clock signal DCLK may include clock pulses having a phase (i.e., the present phase) selected as a phase of the sampling clock signal SCLK.

The delay clock signal DCLK may include a reference delay clock signal rDCLK. The reference delay clock signal rDCLK is delayed with respect to reference clock signal RCLK as much as a reference delay time. The reference delay time may be a time corresponding to a length of one packet of the reception data rDAT. For example, assuming that the first reception data rDAT1 corresponds to one packet of the ideal reception data irDAT and a length of the first reception data rDAT1 is "14 UI", the reference delay time is "14 UI". As such, a phase of the reference delay clock signal rDCLK delayed with respect to reference clock signal RCLK as much as the reference delay time may be identical to a phase of the reference clock signal RCLK.

The sampling clock generator 210 determines a jitter value of the reception data rDAT at a recovery point of the reference clock signal RCLK by using the reference delay clock signal rDCLK. For example, the sampling clock generator 210 may determine a phase difference between the reference delay clock signal rDCLK generated from the first reference clock signal RCLK1 and the second reference clock signal RCLK2. Since the phase of the reference delay clock signal rDCLK is identical to the phase of the first reference clock signal RCLK1, a phase difference between the reference delay clock signal rDCLK and the second reference clock signal RCLK2 may be identical to a phase difference between the first reference clock signal RCLK1 and the second reference clock signal RCLK2. The sampling clock generator 210 may determine a jitter value of the second reception data rDAT2 based on the phase difference.

The sampling clock generator 210 generates the sampling clock signal SCLK having a phase selected according to the determined jitter value. The sampling clock generator 210 may generate the sampling clock signal SCLK having a phase selected by using the delay clock signal DCLK. For example, in the case where the preset phase is selected as a phase of the sampling clock signal SCLK depending on the jitter value of the second reception data rDAT2, the sampling clock generator 210 generates the sampling clock signal SCLK having the preset phase by using the delay clock signal DCLK generated from the second reference clock signal RCLK2. In the case where the delay clock signal DCLK includes a clock signal having the preset phase, the sampling clock generator 210 uses the delay clock signal DCLK without modification (e.g., may bypass the delay clock signal DCLK) to generate the sampling clock signal SCLK.

For example, in the case where the corrected phase is selected as a phase of the sampling clock signal SCLK depending on the jitter value of the second reception data rDAT2, the sampling clock generator 210 generates the sampling clock signal SCLK having the corrected phase by using the delay clock signal DCLK generated from the second reference clock signal RCLK2. In the case where the delay clock signal DCLK does not include a clock signal having the corrected phase, the sampling clock generator 210 corrects a phase of the delay clock DCLK (e.g., may perform phase interpolation or a phase shift on the delay clock signal DCLK) and generates the sampling clock signal SCLK having the corrected phase.

The sampler 230 recovers the reception data rDAT based on the sampling clock signal SCLK output from the sampling clock generator 210. The sampler 230 may output the recovered data sDAT generated according to the recovery of the reception data rDAT.

Figure 8:
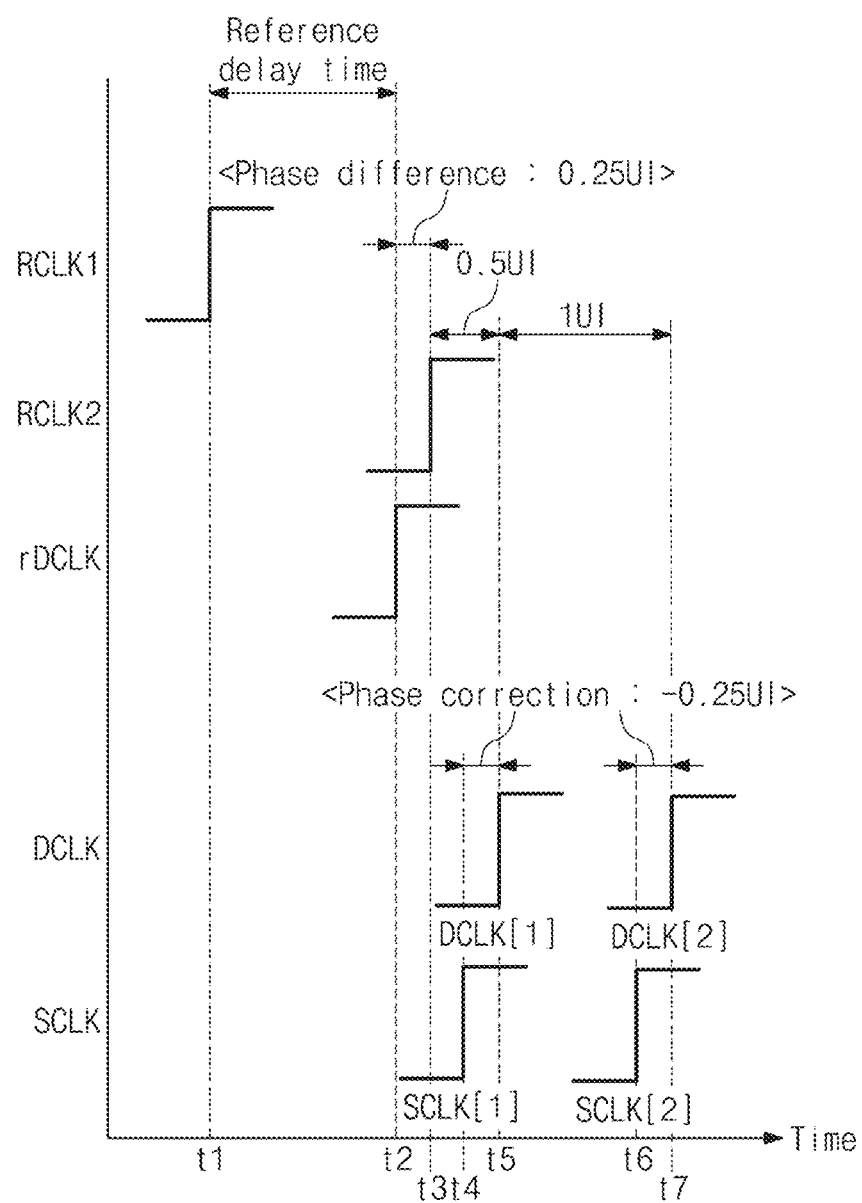
FIG. 8 is a timing diagram for describing an exemplary operation of a data recovery circuit of FIG. 7.

FIG. 8 is a timing diagram for describing an exemplary operation of the data recovery circuit 200 of FIG. 7. Referring to FIGS. 7 and 8, at a first time t1, the clock recovery circuit 100 generates the first reference clock signal RCLK1 based on the first reception data rDAT1. The delay locked loop 220 delays the first reference clock signal RCLK as much as the reference delay time to generate the reference delay clock signal rDCLK. In this case, the reference delay clock signal rDCLK has a rising edge at a second time t2. At a third time t3, the clock recovery circuit 100 generates the second reference clock signal RCLK2 based on the second reception data rDAT2.

The sampling clock generator 210 determines a phase difference between the second reference clock signal RCLK2 and the reference delay clock signal rDCLK as "0.25 UI". As such, the sampling clock generator 210 determines a jitter value of the second reception data rDAT2 as "0.25 UI". The sampling clock generator 210 selects a phase of the sampling clock signal SCLK depending on the determined jitter value. The selected phase of the sampling clock signal SCLK is delayed with respect to a phase of the second reference clock signal RCLK2 as much as "0.25 UI". The sampling clock generator 210 generates the sampling clock signals SCLK[1] and SCLK[2] by using the delay clock signals DCLK[1] and DCLK[2]. The delay clock signals DCLK[1] and DCLK[2] may be generated from the second reference clock signal RCLK2 by the delay locked loop 220. The delay clock signal DCLK[1] is delayed with respect to the second reference clock signal RCLK2 as much as "0.5 UI", and the delay clock signal DCLK[2] is delayed with respect to the delay clock signal DCLK[1] as much as "1 UI". The sampling clock generator 210 corrects the phases of the delay clock signals DCLK[1] and DCLK[2] as much as "−0.25 UI" and generates the sampling clock signals SCLK[1] and SCLK[2]. The sampler 230 samples the second reception data rDAT2 at a fourth time t4 and a sixth time t6 based on the sampling clock signals SCLK[1] and SCLK[2]. For example, the sampler 230 samples the second reception data rDAT2 at a fourth time t4 based on the sampling clock signal SCLK[1] and a sixth time t6 based on the sampling clock signal SCLK[2].

Figure 9:
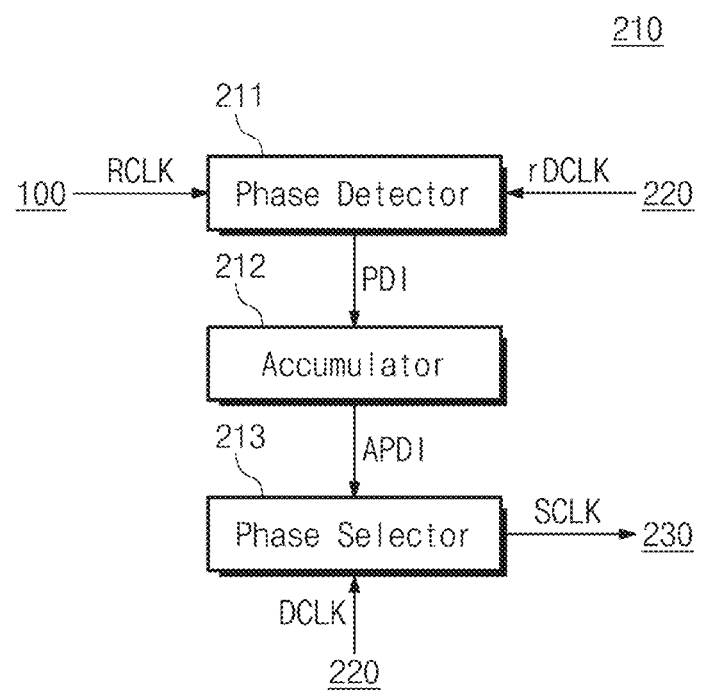
FIG. 9 is a block diagram illustrating an exemplary configuration of a sampling clock generator of FIG. 7.

FIG. 9 is a block diagram illustrating an exemplary configuration of the sampling clock generator 210 of FIG. 7. Referring to FIG. 9, the sampling clock generator 210 includes a phase detector 211 (e.g., a phase detection circuit), an accumulator 212, and a phase selector 213 (e.g., a phase selection circuit).

The phase detector 211 may detect a phase difference PDI between the reference clock signal RCLK and the reference delay clock signal rDCLK. The reference delay clock signal rDCLK may be generated from a previous reference clock signal RCLK by the delay locked loop 220. The phase detector 211 provides the phase difference PDI to the accumulator 212.

The accumulator 212 may accumulate the phase difference PDI to calculate an accumulated phase difference APDI. The accumulator 212 provides the accumulated phase difference APDI to the phase selector 213.

The phase selector 213 selects a phase of the sampling clock signal SCLK based on the accumulated phase difference APDI. The phase selector 213 outputs the sampling clock signal SCLK having the selected phase. The output sampling clock signal SCLK is provided to the sampler 230. The phase selector 213 generates the sampling clock signal SCLK by using the delay clock signal DCLK. The delay clock signal DCLK may be generated from the reference clock signal RCLK by the delay locked loop 220.

Figure 10A:
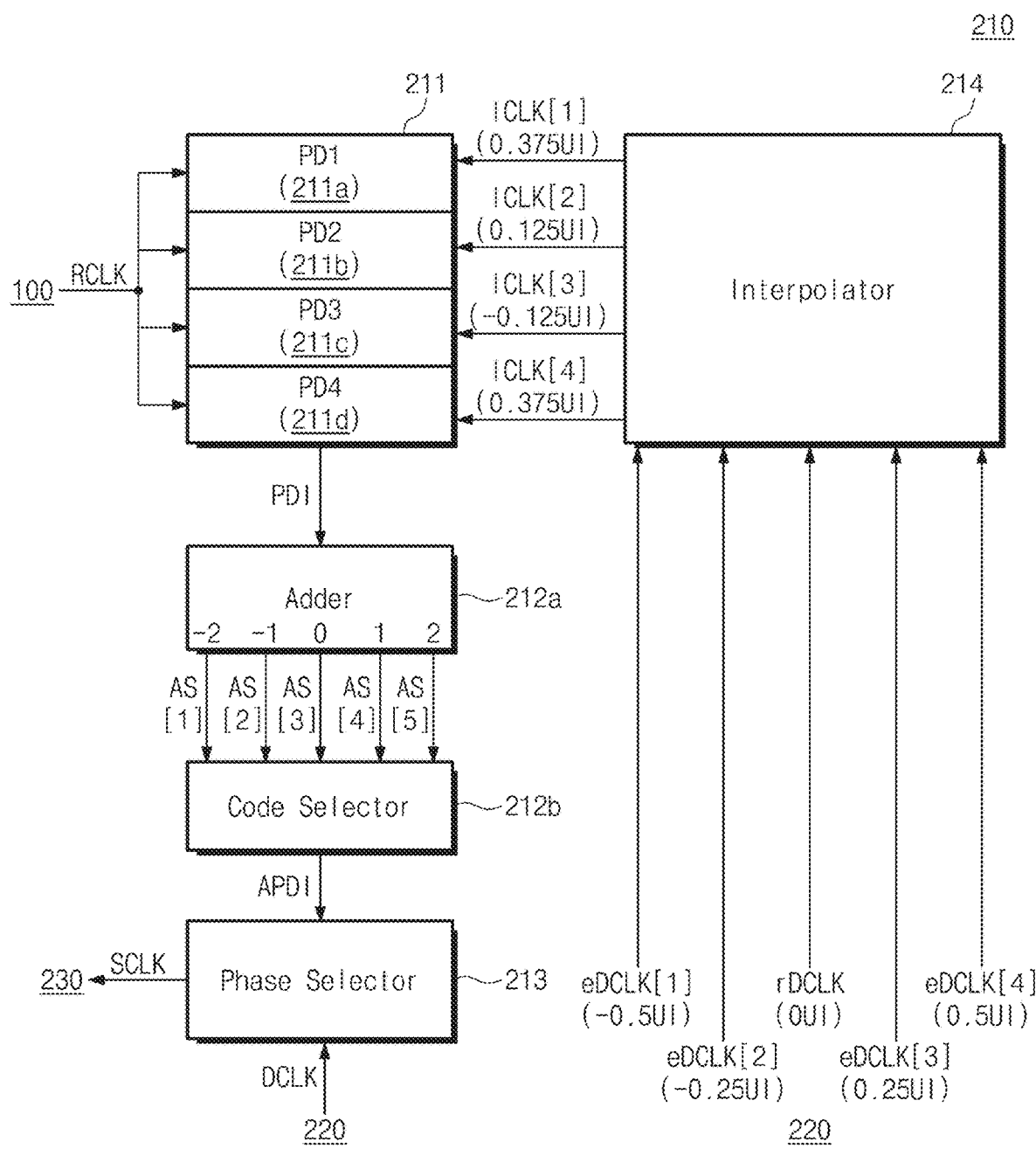
FIG. 10A is a block diagram illustrating an exemplary expansion configuration of a sampling clock generator of FIG. 9.

FIG. 10A is a block diagram illustrating an exemplary expansion configuration of the sampling clock generator 210 of FIG. 9, and FIG. 10B illustrates an example of a table MT for describing an operation of the sampling clock generator 210 of FIG. 10A. In detail, the sampling clock generator 210 of FIG. 10A may operate based on the table MT of FIG. 10B.

Referring to FIGS. 10A and 10B, the sampling clock generator 210 includes the phase detector 211, an adder 212a (e.g., an adder circuit), a code selector 212b, the phase selector 213, and an interpolator 214 (e.g., an interpolation circuit). The adder 212a and the code selector 212b may be included in the accumulator 212 of FIG. 9.

The interpolator 214 receives expansion delay clock signals eDCLK[1] to eDCLK[4] and the reference delay clock signal rDCLK from the delay locked loop 220. The expansion delay clock signals eDCLK[1] to eDCLK[4] and the reference delay clock signal rDCLK may be included in the delay clock signal DCLK generated from the delay locked loop 220. Delay times of the expansion delay clock signals eDCLK[1] to eDCLK[4] may be within a specific range with respect to a delay time (i.e., the reference delay time) of the reference delay clock signal rDCLK. For example, the delay times of the expansion delay clock signals eDCLK[1] to eDCLK[4] may be within "−0.5 UI" to "0.5 UI" with respect to the reference delay time. Assuming that a phase of the reference delay clock signal rDCLK is "0 UI", the phases of the expansion delay clock signals eDCLK[1] to eDCLK[4] may be "−0.5 UI", "−0.25 UI", "0.25 UI", and "0.5 UI", respectively, but the inventive concept is not limited thereto.

The interpolator 214 generates interpolation clock signals ICLK[1] to ICLK[4] through phase interpolation based on the expansion delay clock signals eDCLK[1] to eDCLK[4] and the reference delay clock signal rDCLK. For example, phases of the interpolation clock signals ICLK[1] to ICLK[4] generated through phase interpolation may be "0.375 UI", "0.125 UI", "−0.125 UI", and "−0.375 UI". The interpolator 214 provides the interpolation clock signals ICLK[1] to ICLK[4] to the phase detector 211.

The phase detector 211 includes first to fourth phase detecting circuits 211a to 211d. The first phase detecting circuit 211a compares a phase of the reference clock signal RCLK and a phase of the interpolation clock signal ICLK[1] and may output a comparison result. For example, when a phase of the reference clock RCLK signal is advanced with respect to a phase of the interpolation clock signal ICLK[1], the first phase detecting circuit 211a may output "1" as a comparison result. When a phase of the reference clock signal RCLK is delayed with respect to a phase of the interpolation clock signal ICLK[1], the first phase detecting circuit 211a may output "0" as a comparison result. However, the inventive concept is not limited thereto. Likewise, the second to fourth phase detecting circuits 211b to 211d compares a phase of the reference clock signal RCLK and phases of the interpolation clock signals ICLK[2] to ICLK[4] and may output comparison results.

That is, the comparison results output from the phase detector 211 may be in the form of a binary code as illustrated in FIG. 10B. That is, the phase difference PDI output from the phase detector 211 may be in the form of a code. The phase detector 211 may provide the phase difference PDI to the adder 212a.

The adder 212a may accumulate the phase difference PDI. In the case where the phase difference PDI expressed in the form of a code is received, the adder 212a may determine the phase difference PDI as a decimal value corresponding to a code. For example, as illustrated in FIG. 10B, in the case where a code of "0000" is received, the adder 212a may determine the phase difference PDI as "−2". In the case where a code of "1100" is received, the adder 212a may determine the phase difference PDI as "0".

The adder 212a may calculate an accumulated value based on the determined phase difference PDI. For example, the accumulated values calculated from the adder 212a may be "−2", "4", "0", "1", and "2". That is, the adder 212a may calculate an accumulated value such that the accumulated value corresponds to a decimal value of the table MT of FIG. 10B. For example, the adder 212a may in advance calculate accumulated values in a look-ahead manner and may select one of the accumulated values calculated in advance based on the received phase difference PDI.

The adder 212a may provide an accumulation signal AS corresponding to an accumulated value to the code selector 212b. For example, in the case where an accumulated value is "−2", the adder 212a may provide an accumulation signal AS[1] to the code selector 212b.

The code selector 212b may output one of a plurality of codes stored in advance based on the accumulation signal AS provided from the adder 212a. The code selector 212b may in advance store the codes of FIG. 10B. For example, in the case where the accumulation signal AS[1] corresponding to "−2" is provided, the code selector 212b may output a code of "0000". As such, the accumulated phase difference APDI output from the code selector 212b may be expressed in the form of a code. The code selector 212b provides the accumulated phase difference APDI to the phase selector 213.

The phase selector 213 selects a phase of the sampling clock signal SCLK based on the accumulated phase difference APDI. To select a phase, the phase selector 213 may use the table MT of FIG. 10B. The phase selector 213 may apply a phase correction value corresponding to the accumulated phase difference APDI. For example, in the case where the accumulated phase difference APDI is "1100", the phase selector 213 may apply "0 UI" as the phase correction value. That is, the phase selector 213 may select the preset phase as a phase of the sampling clock signal SCLK. In the case where the accumulated phase difference APDI is "1110", the phase selector 213 may apply "0.25 UI" as the phase correction value. That is, the phase selector 213 may select a phase, which is delayed with respect to the preset phase as much as "0.25 UI", as a phase of the sampling clock signal SCLK. The phase selector 213 may generate the sampling clock signal SCLK having a phase selected by using the delay clock signal DCLK.

The examples described with reference to FIGS. 10A and 10B are for describing a detailed operation of the sampling clock generator 210, but the inventive concept is not limited thereto. For example, in the case where a phase interval of the interpolation clock signal ICLK generated by the interpolator 214 decreases (i.e., in the case where the number of interpolation clock signals ICLK increases), the number of codes to be output from the phase detector 211 may increase. In this case, the sampling clock generator 210 may perform phase correction more accurately depending on a phase correction value corresponding to each code.

As illustrated in FIG. 10A, the sampling clock generator 210 according to an embodiment of the inventive concept may be implemented only with a digital circuit of a gate level without including an analog circuit. However, the inventive concept is not limited thereto. For example, the sampling clock generator 210 according to an embodiment of the inventive concept includes an analog circuit.

Figure 11A:
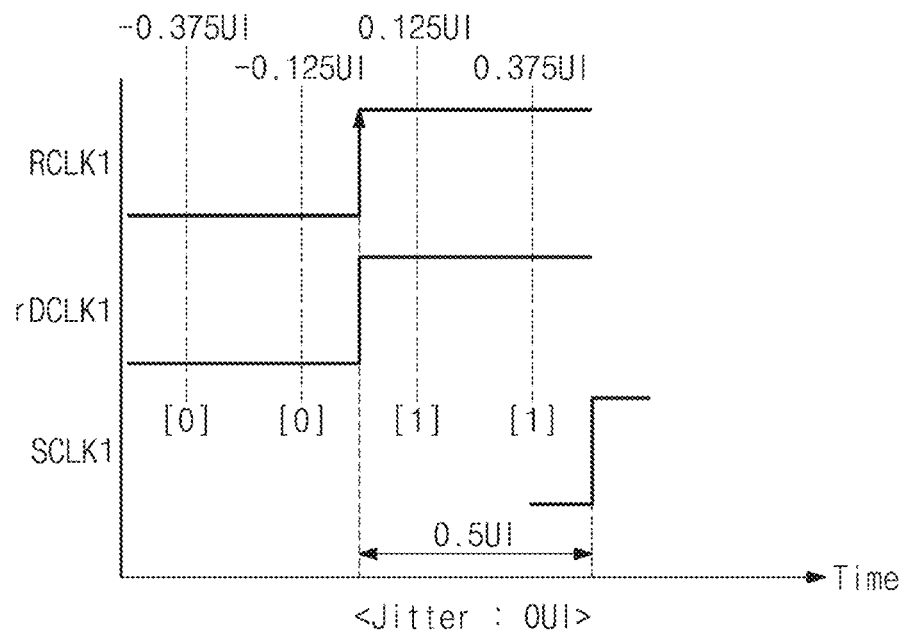
FIGS. 11A to 11C are timing diagrams for describing examples of operations of a sampling clock generator of FIG. 10A.
Figure 11B:
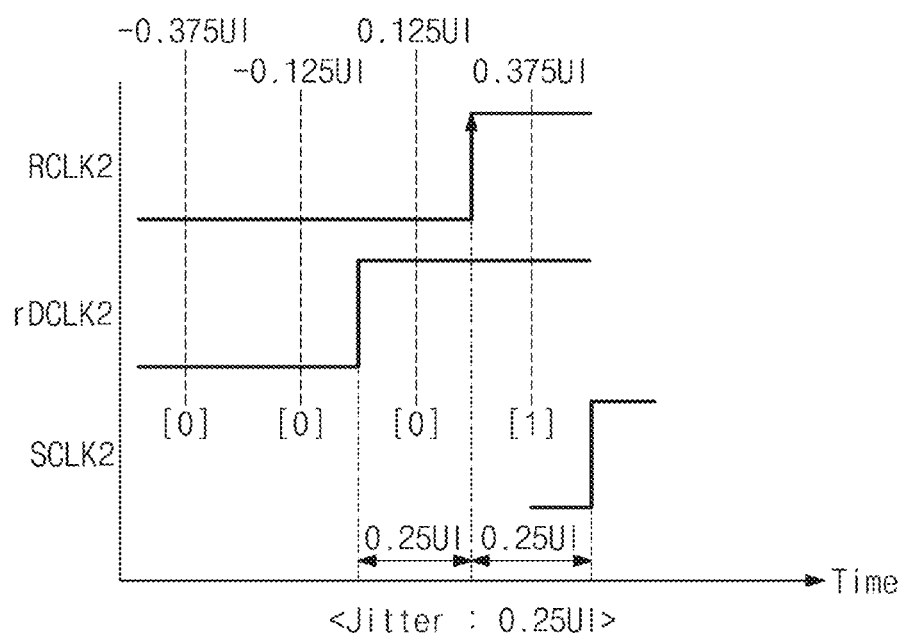
Figure 11C:
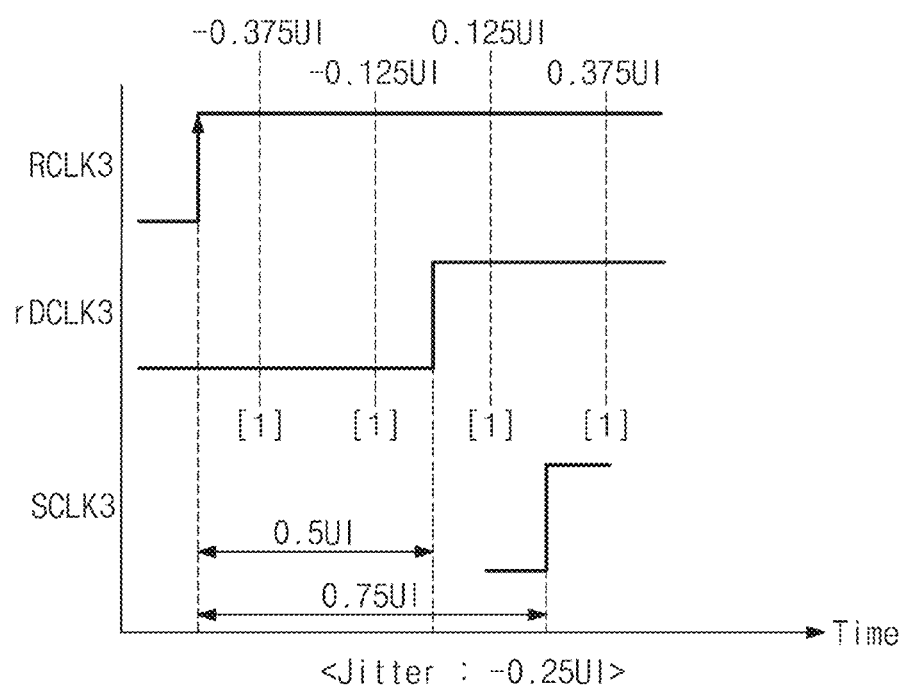

FIGS. 11A to 11C are timing diagrams for describing examples of operations of the sampling clock generator 210 of FIG. 10A. It is assumed that the sampling clock generator 210 sequentially performs operations to be described with reference to FIGS. 11A to 11C.

A first sampling clock signal SCLK1 generated by the sampling clock generator 210 in the case where a jitter value of the reception data rDAT is "0 UI" at a recovery point of the first reference clock signal RCLK1 is illustrated in FIG. 11A. In the case where a jitter value of the reception data rDAT is "0 UI" at a recovery point of a previous reference clock signal RCLK before the first reference clock signal RCLK1, a phase of a first reference delay clock signal rDCLK1 generated from the previous reference clock signal RCLK and a phase of the first reference clock signal RCLK1 is identical. In this case, the phase difference PDI output from the first to fourth phase detecting circuits 211a to 211d may be "1100". The adder 212a may output an accumulation signal AS[3] corresponding to "0" based on the provided phase difference PDI. The code selector 212b may output "1100" as the accumulated phase difference APDI in response to the accumulation signal AS[3]. The phase selector 213 may apply "0 UI" corresponding to "1100" as a phase correction value. As such, the phase selector 213 may select the preset phase as a phase of the first sampling clock signal SCLK1. That is, the phase of the first sampling clock signal SCLK1 may be delayed with respect to a phase of the first reference clock signal RCLK1 as much as "0.5 UI".

A second sampling clock signal SCLK2 generated by the sampling clock generator 210 in the case where a jitter value of the reception data rDAT is "0.25 UI" at a recovery point of the second reference clock signal RCLK2 is illustrated in FIG. 11B. Since a jitter value of the reception data rDAT is "0 UI" at the recovery point of the first reference clock signal RCLK1, a phase of a second reference delay clock signal rDCLK2 generated from the first reference clock signal RCLK1 is advanced with respect to a phase of the second reference clock signal RCLK2 as much as "0.25 UI". In this case, the phase difference PDI output from the first to fourth phase detecting circuits 211a to 211d may be "1000". The adder 212a may calculate an accumulated value by adding "−1" corresponding to the phase difference PDI and a previously stored "0" together. As such, the adder 212a may output an accumulation signal AS[2] corresponding to "−1". The code selector 212b may output "1000" as the accumulated phase difference APDI in response to the accumulation signal AS[2]. The phase selector 213 may apply "−0.25 UI" corresponding to "1000" as a phase correction value. As such, the phase selector 213 may select a phase, which is advanced with respect to the preset phase as much as "0.25 UI", as a phase of the second sampling clock signal SCLK2. That is, the phase of the second sampling clock signal SCLK2 may be delayed with respect to a phase of the second reference clock signal RCLK2 as much as "0.25 UI".

A third sampling clock signal SCLK3 generated by the sampling clock generator 210 in the case where a jitter value of the reception data rDAT is "−0.25 UI" at a recovery point of the third reference clock RCLK3 is illustrated in FIG. 11C. Since a jitter value of the reception data rDAT is "0.25 UI" at the recovery point of the second reference clock signal RCLK2, a phase of a third reference delay clock signal rDCLK3 generated from the second reference clock signal RCLK2 may be delayed with respect to a phase of the third reference clock signal RCLK3 as much as "0.5 UI". In this case, the phase difference PDI output from the first to fourth phase detecting circuits 211a to 211d may be "1111". The adder 212a may calculate an accumulated value by adding "2" corresponding to the phase difference PDI and a previously stored "−1" together. As such, the adder 212a may output an accumulation signal AS[4] corresponding to "1". The code selector 212b may output "1110" as the accumulated phase difference APDI in response to the accumulation signal AS[4]. The phase selector 213 may apply "0.25 UI" corresponding to "1110" as a phase correction value. As such, the phase selector 213 may select a phase, which is delayed with respect to the preset phase as much as "0.25 UI", as a phase of the third sampling clock signal SCLK3. That is, the phase of the third sampling clock signal SCLK3 may be delayed with respect to a phase of the third reference clock RCLK3 signal as much as "0.75 UI".

As described above, according to the sampling clock generator 210 described with reference to FIG. 10A, in the case where a jitter value is within a range from "−0.125 UI" to "0.125 UI" at a recovery point of the reference clock signal RCLK (or in the case where the accumulated phase difference APDI is within a range from "−0.125 UI" to "0.125 UI"), a phase correction value may be "0 UI". That is, a phase of the sampling clock signal SCLK is not corrected. In the case where a jitter value exceeds the range from "−0.125 UI" to "0.125 UI" at a recovery point of the reference clock signal RCLK (or in the case where the accumulated phase difference APDI exceeds the range from "−0.125 UI" to "0.125 UI"), a phase of the sampling clock signal SCLK is corrected. In this case, the reference range may be "−0.125 UI" to "0.125 UI".

As described above, the data recovery circuit 200 according to embodiments of the inventive concept may adjust a sampling timing depending on a jitter value of the reception data rDAT. As such, bit errors may decrease upon recovering the reception data rDAT. Also, in the case where the sampling timing is adjusted, a sampling margin may increase, and a jitter tolerance may be improved.

Figure 12:
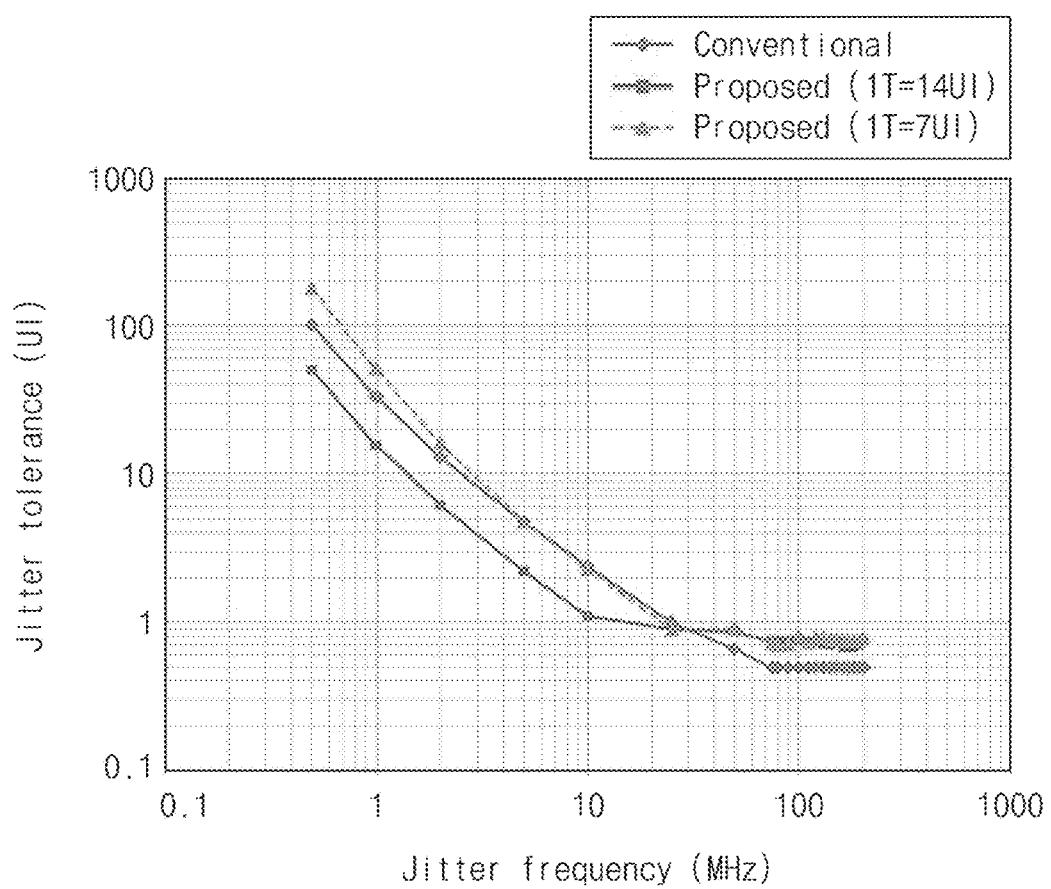
FIG. 12 is graph illustrating a simulation result according to exemplary embodiments of the inventive concept.

FIG. 12 is graph illustrating a simulation result according to embodiments of the inventive concept. Referring to FIG. 12, a change of a jitter tolerance according to a jitter frequency is illustrated. In FIG. 12, the horizontal axis represents a jitter frequency, and the vertical axis represents a jitter tolerance.

In the case where a jitter frequency is relatively low (e.g., in the case where a jitter frequency is lower than 10 MHz), according to the related art and embodiments of the inventive concept, a jitter tolerance is not smaller than "1 UI". However, in the case where a jitter frequency is relatively high (e.g., in the case where a jitter frequency is higher than 70 MHz), according to the related art, a jitter tolerance may be about "0.5 UI". In contrast, in the case where a jitter frequency is relatively high, according to embodiments of the inventive concept, a jitter tolerance may be about "0.7 UI". That is, according to embodiments of the inventive concept, a minimum value of a jitter tolerance may be improved compared with the related art. Accordingly, according to embodiments of the inventive concept, the occurrence of a bit error may decrease.

According to embodiments of the inventive concept, a jitter tolerance may vary with a length "1T" of one packet of the reception data rDAT. The length "1T" of one packet may be determined according to the interface protocol (i.e., the communication protocol). As illustrated in FIG. 12, in a period where a jitter frequency is relatively low, a jitter tolerance corresponding to the case where the length "1T" of one packet is "14 UI" is smaller than a jitter tolerance according to the related art. However, in a period where a jitter frequency is relatively low, a jitter tolerance corresponding to the case where the length "1T" of one packet is "7 UI" may be similar to a jitter tolerance according to the related art. That is, according to embodiments of the inventive concept, a minimum value of a jitter tolerance may be improved without a loss of a jitter tolerance in a period where a jitter frequency is relatively low.

Figure 13:
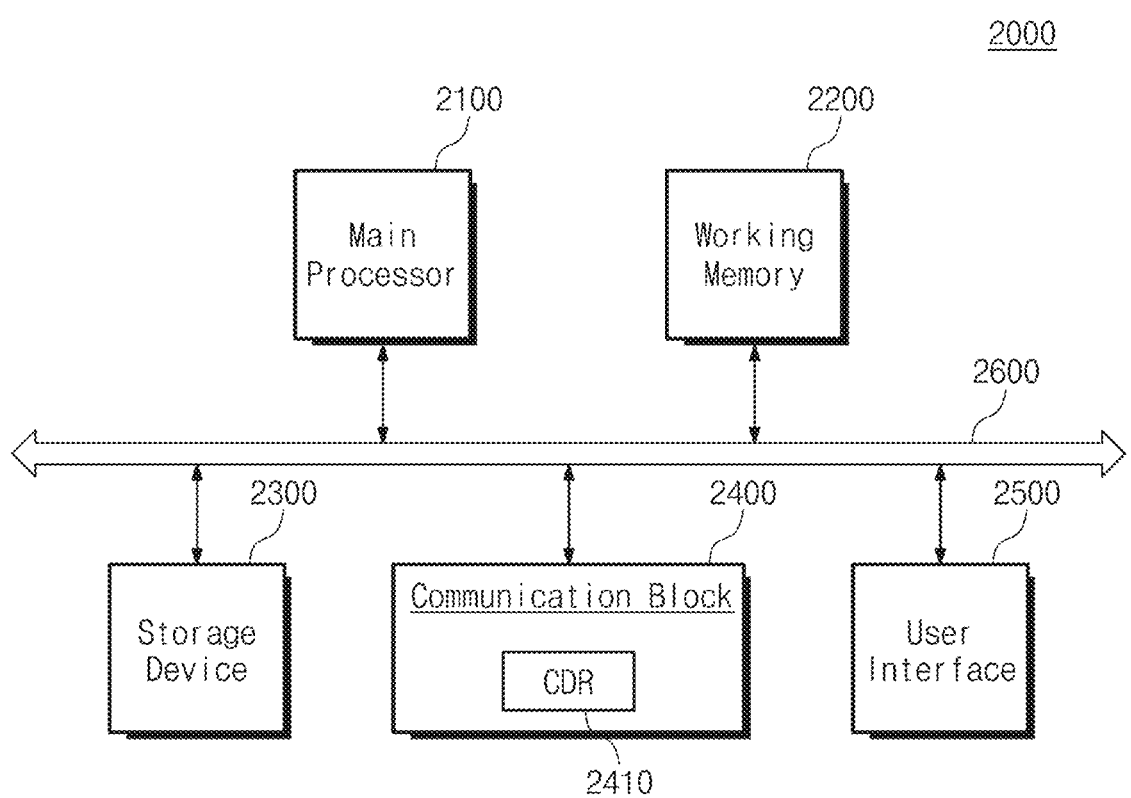
FIG. 13 is a block diagram illustrating an exemplary configuration of an electronic system according to an exemplary embodiment of the inventive concept.

FIG. 13 is a block diagram illustrating an exemplary configuration of an electronic system 2000 according to an exemplary embodiment of the inventive.

The electronic system 2000 includes a main processor 2100, a working memory 2200, a storage device 2300, a communication block 2400, a user interface 2500, and a bus 2600.

For example, the electronic system 2000 may be one of a desktop computer, a laptop computer, a tablet computer, a smartphone, a wearable device, an electric vehicle, and a workstation. The electronic system 2000 may be an electronic device used by an end-user, or may be an element of a large-scale system such as a server system or a data center.

The main processor 2100 may control overall operations of the electronic system 2000. The main processor 2100 may process various kinds of arithmetic operations and/or logical operations. For example, the main processor 2100 may be implemented with a general-purpose processor, a special-purpose processor, or an application processor.

The working memory 2200 may store data to be used for an operation of the electronic system 2000. In an embodiment, the working memory 2200 may temporarily store data processed or to be processed by the main processor 2100. For example, the working memory 2200 may include a volatile memory, such as a dynamic random access memory (DRAM) a synchronous DRAM (SDRAM), or the like, and/or a nonvolatile memory, such as a phase-change RAM (PRAM), a magneto-resistive RAM (MRAM), a resistive RAM (ReRAM), a ferroelectric RAM (FRAM), or the like.

The storage device 2300 may store data regardless of whether power is supplied. For example, the storage device 2300 may include a nonvolatile memory such as a flash memory, a PRAM, an MRAM, a ReRAM, an FRAM, etc. For example, the storage device 2300 may include a storage medium such as a hard disk drive (HDD), a solid state drive (SSD), card storage, or embedded storage.

The communication block 2400 may communicate with an external device or an external system of the electronic system 2000. The communication block 2400 may be an element capable of providing a communication service, such as a modulator/demodulator (MODEM) chip or device, a network card, a communication switch, a hub, or a router. For example, the communication block 2400 may support at least one of various wireless communication protocols such as LTE, WIMAX, GSM, CDMA, Bluetooth, near field communication (NFC), Wi-Fi, and RFID and/or at least one of various wired communication protocols such as TCP/IP, USB, and Firewire.

The communication block 2400 may include various electronic circuits, such as a transmitter, a receiver, and a CDR circuit 2410, for the purpose of providing a communication service. The CDR circuit 2410 may include the clock recovery circuit 100 and the data recovery circuit 200 described with reference to FIGS. 1 to 12. That is, the CDR circuit 2410 may adjust a sampling timing based on a jitter value of reception data. Accordingly, a sampling timing error may be prevented, and a jitter tolerance may increase.

The user interface 2500 may perform communication arbitration between a user and the electronic system 2000. For example, the user interface 2500 may include input interfaces such as a keyboard, a mouse, a keypad, a button, a touch panel, a touch screen, a touch pad, a touch ball, a camera, a microphone, a gyroscope sensor, and a vibration sensor. For example, the user interface 2500 may include output interfaces such as a liquid crystal display (LCD) device, a light emitting diode (LED) display device, an organic LED (OLED) display device, an active matrix OLED (AMOLED) display device, a speaker, and a motor.

The bus 2600 may provide a communication path between the components of the electronic system 2000. The components of the electronic system 2000 may exchange data with each other based on a bus format of the bus 2600. For example, a bus format may include one or more of various interface protocols such as USB, small computer system interface (SCSI), peripheral component interconnect express (PCIe), mobile PCIe (M-PCIe), advanced technology attachment (ATA), parallel ATA (PATA), serial ATA (SATA), serial attached SCSI (SAS), integrated drive electronics (IDE), enhanced IDE (EIDE), nonvolatile memory express (NVMe), and universal flash storage (UFS).

According to at least one embodiment of the inventive concept, an electronic circuit may be provided for adjusting a sampling timing depending on a jitter value of reception data.

According to at least one embodiment of the inventive concept, bit errors in recovered reception data may be decreases, and a jitter tolerance may be improved as a sampling margin increases.

While the inventive concept has been described with reference to exemplary embodiments thereof, it will be apparent to those of ordinary skill in the art that various changes and modifications may be made thereto without departing from the spirit and scope of the present disclosure.

What is claimed is:

1. An electronic circuit comprising:
    a clock recovery circuit configured to generate a first reference clock signal based on first reception data and to generate a second reference clock signal based on second reception data received after the first reception data;
    a sampling clock generator configured to generate a sampling clock signal having a phase based on a phase difference between the first reference clock signal and the second reference signal clock;
    a sampler configured to recover the second reception data based on the generated sampling clock signal; and
    a delay locked loop configured to output a first delay clock signal by delaying the first reference clock signal by a reference delay time.

2. The electronic circuit of claim 1, wherein the clock recovery circuit is further configured to generate a third reference clock signal based on third reception data received after the second reception data,
    wherein the sampling clock generator is further configured to adjust the phase of the sampling clock signal based on a phase difference between the second reference clock signal and the third reference clock signal, and
    wherein the sampler is further configured to recover the third reception data based on the sampling clock signal, the phase of which is adjusted.

3. The electronic circuit of claim 1,
    wherein the sampling clock generator determines the phase difference between the first reference clock signal and the second reference clock signal based on the second reference clock signal and the first delay clock signal.

4. The electronic circuit of claim 3, wherein the delay locked loop is further configured to output a second delay clock signal having a preset phase by delaying the second reference clock signal, and
wherein the sampling clock generator generates the sampling clock signal having the preset phase based on the second delay clock signal.

5. The electronic circuit of claim 3, wherein the sampling clock generator comprises:
a phase detector configured to detect the phase difference based on the second reference clock signal and the first delay clock signal;
an accumulator configured to calculate an accumulated phase difference based on the detected phase difference; and
a phase selector configured to select the phase of the sampling clock signal based on the accumulated phase difference and to output the sampling clock signal having the selected phase.

6. The electronic circuit of claim 5, wherein the sampling clock generator further comprises:
an interpolator configured to generate interpolation clock signals through phase interpolation based on delay clock signals including the first delay clock signal, and
wherein the phase detector compares a phase of the second reference clock signal and phases of the interpolation clock signals to detect the phase difference.

7. The electronic circuit of claim 5, wherein the phase selector outputs the sampling clock signal having a preset phase when the accumulated phase difference is within a reference range and outputs the sampling clock signal having a corrected phase through a comparison with the preset phase when the accumulated phase difference exceeds the reference range.

8. An electronic circuit comprising:
a clock recovery circuit configured to generate a reference clock signal based on reception data; and
a data recovery circuit configured to recover the reception data based on a sampling clock signal having a phase selected according to a jitter value of the reception data at a recovery point of the reference clock signal;
wherein, when the jitter value of the reception data exceeds a reference range at the recovery point of the reference clock signal, the data recovery circuit recovers the reception data based on the sampling clock signal having a phase corrected through a comparison with a preset phase.

9. The electronic circuit of claim 8, wherein, when the jitter value of the reception data is within the reference range at the recovery point of the reference clock signal, the data recovery circuit recovers the reception data based on the sampling clock signal having the preset phase.

10. The electronic circuit of claim 9, wherein a phase difference between the sampling clock signal having the preset phase and the reference clock signal is a preset specific value.

11. The electronic circuit of claim 8, wherein, when the jitter value of the reception data exceeds the reference range at the recovery point of the reference clock signal, the data recovery circuit corrects a phase of the sampling clock signal by a phase corresponding to the jitter value.

12. The electronic circuit of claim 8, wherein the data recovery circuit comprises:
a delay locked loop configured to generate a first delay clock signal by delaying a previous reference clock signal recovered before the recovery point of the reference clock signal by a reference delay time;
a sampling clock generator configured to determine the jitter value of the reception data based on the reference signal clock and the first delay clock signal and to output the sampling clock signal having the selected phase depending on the determined jitter value; and
a sampler configured to recover the reception data based on the output sampling clock signal.

13. The electronic circuit of claim 12, wherein the sampling clock generator determines the jitter value of the reception data based on a phase difference between the reference clock signal and the first delay clock signal.

14. The electronic circuit of claim 12, wherein the delay locked loop is further configured to generate a second delay clock signal having a preset phase by delaying the reference clock signal, and
wherein the sampling clock generator generates the sampling clock signal based on the second delay clock signal.

15. The electronic circuit of claim 12, wherein the reference delay time corresponds to a length of one packet of the reception data.

16. An electronic circuit comprising:
a delay locked loop configured to output a first delay clock signal by delaying a first reference clock signal generated based on reception data by a reference delay time;
a sampling clock generator configured to select a first phase of a first sampling clock signal based on a first phase difference between a second reference clock signal generated based on the reception data and the first delay clock signal; and
a sampler configured to recover the reception data based on the first sampling clock signal having the selected first phase,
wherein the second reference clock signal is generated after the first reference clock signal is generated.

17. The electronic circuit of claim 16, wherein the delay locked loop is further configured to output a second delay clock signal by delaying the second reference clock signal by the reference delay time,
wherein the sampling clock generator is further configured to select a second phase of a second sampling clock signal based on a phase difference which is obtained by accumulating the first phase difference and a second phase difference between a third reference clock signal generated based on the reception data and the second delay clock signal,
wherein the sampler is configured to recover the reception data based on the second sampling clock signal having the selected second phase, and
wherein the third reference clock signal is generated after the second reference clock signal is generated.

18. The electronic circuit of claim 17, wherein the first phase of the first sampling clock signal is different from the second phase of the second sampling clock signal.

19. The electronic circuit of claim 17, wherein the sampling clock generator selects the second phase as a preset phase when the accumulated phase difference is within a reference range and selects the second phase as a corrected phase through a comparison with the preset phase when the accumulated phase difference exceeds the reference range.

* * * * *